US012777825B2

(12) United States Patent
Choi et al.

(10) Patent No.: US 12,777,825 B2
(45) Date of Patent: Oct. 27, 2026

(54) FLEXIBLE DISPLAY DEVICE

(71) Applicant: LG Display Co., Ltd., Seoul (KR)

(72) Inventors: Suk Choi, Hwaseong-si (KR); Miyeon Seo, Namyangju-si (KR); Mose Lee, Bucheon-si (KR); MooJin Kwak, Incheon (KR); Sungjin Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 364 days.

(21) Appl. No.: 18/381,050

(22) Filed: Oct. 17, 2023

(65) Prior Publication Data

US 2024/0224764 A1 Jul. 4, 2024

(30) Foreign Application Priority Data

Dec. 30, 2022 (KR) ........................ 10-2022-0190471

(51) Int. Cl.
*H10K 59/80* (2023.01)
*H10K 59/12* (2023.01)
*H10K 59/38* (2023.01)

(52) U.S. Cl.
CPC ..... *H10K 59/8792* (2023.02); *H10K 59/1201* (2023.02); *H10K 59/38* (2023.02)

(58) Field of Classification Search
CPC . H10K 59/8792; H10K 59/1201; H10K 59/38
See application file for complete search history.

(56) References Cited

U.S. PATENT DOCUMENTS

| | | | | |
|---|---|---|---|---|
| 2017/0194399 | A1 | 7/2017 | Cho et al. | |
| 2019/0326545 | A1 | 10/2019 | Joo et al. | |
| 2021/0074770 | A1* | 3/2021 | Choe | G02B 5/206 |
| 2021/0202594 | A1 | 7/2021 | Jo et al. | |
| 2021/0217990 | A1 | 7/2021 | Kim et al. | |
| 2022/0190045 | A1 | 6/2022 | Lee et al. | |
| 2022/0392978 | A1 | 12/2022 | Bae et al. | |

FOREIGN PATENT DOCUMENTS

| | | | |
|---|---|---|---|
| CN | 112466908 | A | 3/2021 |
| JP | 2010-287421 | A | 12/2010 |
| JP | 2011-29162 | A | 2/2011 |

(Continued)

*Primary Examiner* — Anne M Hines
(74) *Attorney, Agent, or Firm* — Birch, Stewart, Kolasch & Birch, LLP

(57) ABSTRACT

Discussed is a flexible display device including a substrate on which sub-pixels are defined, an organic light emitting element disposed on the substrate and disposed to correspond to each sub-pixel of the sub-pixels, an encapsulation layer on the organic light emitting element, a plurality of color filters disposed on the encapsulation layer to correspond to the sub-pixels, respectively, a black matrix disposed between the plurality of color filters, a plurality of spacers positioned between the plurality of color filters and disposed on the black matrix, and an overcoating layer disposed to cover the plurality of color filters, the black matrix, and the plurality of spacers. Each of the plurality of spacers has a first surface closest to the encapsulation layer and a second surface distal from the first surface, and a width of the second surface is greater than a width of the first surface.

20 Claims, 15 Drawing Sheets

(56) References Cited

FOREIGN PATENT DOCUMENTS

| | | | |
|---|---|---|---|
| JP | 2012-124103 | A | 6/2012 |
| JP | 2012-160475 | A | 8/2012 |
| JP | 2017-117787 | A | 6/2017 |
| JP | 2020-67766 | A | 4/2020 |
| JP | 2021-110936 | A | 8/2021 |
| JP | 2022-171000 | A | 11/2022 |
| KR | 10-2017-0080249 | A | 7/2017 |
| KR | 10-2019-0122919 | A | 10/2019 |
| KR | 10-2021-0030538 | A | 3/2021 |
| KR | 10-2021-0084913 | A | 7/2021 |
| KR | 10-2021-0090337 | A | 7/2021 |
| KR | 10-2022-0086771 | A | 6/2022 |
| WO | WO 2018/079017 | A1 | 5/2018 |

* cited by examiner

FLEXIBLE DISPLAY DEVICE

CROSS-REFERENCE TO RELATED APPLICATIONS

This application claims priority to Korean Patent Application No. 10-2022-0190471 filed on Dec. 30, 2022 in the Republic of Korea, the entire contents of which are hereby expressly incorporated by reference into the present application.

BACKGROUND OF THE DISCLOSURE

Field

The present disclosure relates to a display device, and more particularly, to a display device in which breakage or delamination due to bending or folding thereof can be prevented or reduced, and in which a moiré phenomenon can be prevented or reduced based on spacers.

Discussion of the Related Art

Organic light emitting display (OLED) devices do not require a separate light source to generate light, unlike liquid crystal display (LCD) devices having backlight units that are unable to self-luminate. Therefore, the organic light emitting display devices can be manufactured to be lightweight and thin, is advantageous in manufacturing processes, and has advantages of low power consumption due to a low voltage driving, since use of backlight units are avoided. Above all, the organic light emitting display device includes a self-light emitting element and can have layers each formed of a thin organic thin film, so the organic light emitting display device can have excellent or improved flexibility and elasticity compared to other display devices, and thus can be advantageously implemented as a flexible display device that is able to be folded, rolled or bent.

In general, an organic light emitting display device includes an anode, a cathode, and an organic light emitting layer disposed therebetween. As the cathode is formed using a metallic material having high reflectivity, external light is reflected by the metallic material, thereby causing a defect or a disadvantage such as a decrease in contrast ratio or reflective visibility. Accordingly, a polarizing plate for absorbing external light can be disposed below a cover member in order to reduce reflection by external light. The polarizing plate is a film having a certain level of light transmittance and absorbs external light and its reflected light to thereby prevent a decrease in contrast ratio.

Recently, as interest in flexible and slim display devices has increased, display devices using a relatively thin coated polarizing film instead of a thick polarizing plate have been proposed. However, even the coated polarizing film is also thick and not sufficiently thin to be used in a foldable display, and when the thickness of the polarizing film is reduced, functions and display quality of the polarizing film are degraded as there is a point when the polarizing film is too thin to be functional. Accordingly, it is difficult to implement a flexible display device that is subjected to a large amount of stress during folding when using the polarizing film. In addition, the polarizing plate and the polarizing film also have a defect of lowering luminous efficiency by partially absorbing light emitted from an organic light emitting layer, and leads to decreased utility.

SUMMARY OF THE DISCLOSURE

In order to solve or address the above limitations, a color filter on encapsulation layer (CoE) structure has been proposed instead of a polarizing plate or a coated polarizing film. A conventional CoE structure is a structure in which a black matrix is disposed on an encapsulation layer to correspond to a non-emission area and a color filter is disposed to cover at least a portion of the black matrix. In addition, an overcoating layer is disposed to planarize upper surfaces of the color filter and the black matrix. This CoE structure can reduce a thickness of a display device and at the same time, improve display quality by absorbing external light and reflected light without reducing luminous efficiency. However, when a flexible display device is bent or folded, there can be a limitation in which the overcoating layer can be cracked or delaminated.

Accordingly, an aspect of the present disclosure is to provide a display device in which damage to or delamination of the aforementioned overcoating layer can be prevented or minimized.

Another aspect of the present disclosure is to provide a display device in which a moiré phenomenon caused by a color filter can be prevented.

Still another aspect of the present disclosure is to allow for slimming of a display device and easily implement the display device in various shapes such as a curved shape or a foldable shape.

Still another aspect of the present disclosure is to provide a display device with improved display quality by absorbing external light and reflected light while having excellent luminous efficiency.

Objectives of the present disclosure are not limited to the above-mentioned objectives, and other objectives, which are not mentioned above, can be clearly understood by those skilled in the art from the following descriptions.

A display device according to an example embodiment of the present disclosure includes a substrate on which a plurality of sub-pixels are defined; an organic light emitting element disposed on the substrate and disposed to correspond to each of the plurality of sub-pixels; an encapsulation layer on the organic light emitting element; a plurality of color filters disposed on the encapsulation layer to correspond to the plurality of sub-pixels; a black matrix disposed between the plurality of color filters; a plurality of spacers positioned between the plurality of color filters and disposed on the black matrix; and an overcoating layer disposed to cover the color filter, the black matrix, and the spacers, wherein each of the plurality of spacers has a reverse tapered shape.

Other detailed matters of the example embodiments are included in the detailed description and the drawings.

The display device according to the present disclosure has advantages in that it can be easily implemented in various shapes such as a curved shape or a foldable shape since cracks or delamination of an overcoating layer due to bending or folding thereof are prevented.

According to the present disclosure, display quality can be improved by preventing a moiré phenomenon caused by color filters.

The display device according to the present disclosure can improve reflective visibility by absorbing external light and reflected light.

In the display device according to the present disclosure, by forming a black matrix, color filters, and a touch sensor unit having an anti-reflection function inside the display device, it is possible to improve reflective visibility and allow for touch implementation and at the same time, to reduce an overall thickness of the display device.

The effects according to the present disclosure are not limited to the contents exemplified above, and more various effects are included in the present specification.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE EMBODIMENTS

Figure 1:
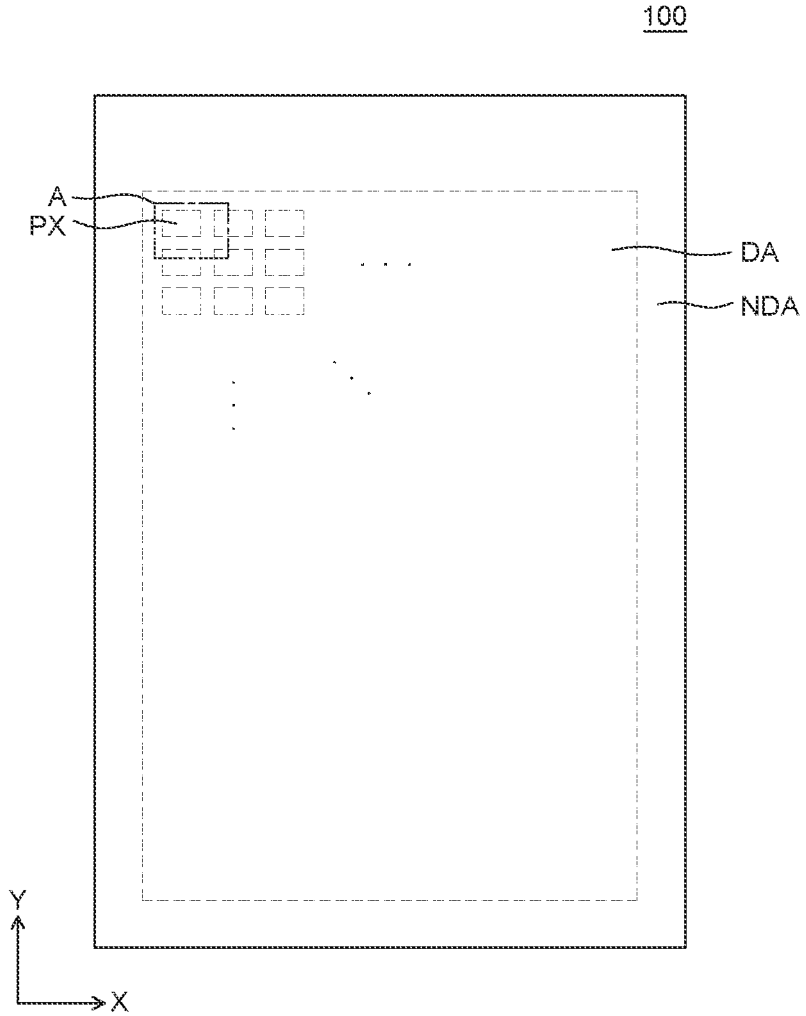
FIG. 1 is a plan view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to a singular of an element can include a plural of the element unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order or sequence. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings. All the components of each display device according to all embodiments of the present disclosure are operationally coupled and configured.

Figure 2:
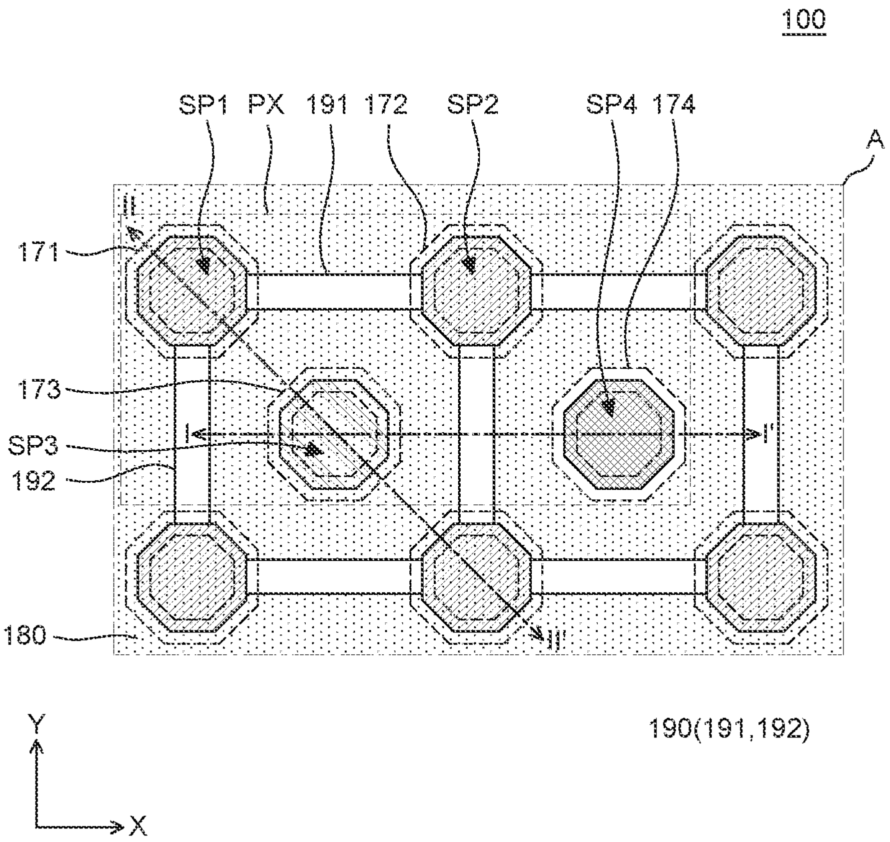
FIG. 2 is an enlarged plan view of area A of FIG. 1.
Figure 3:
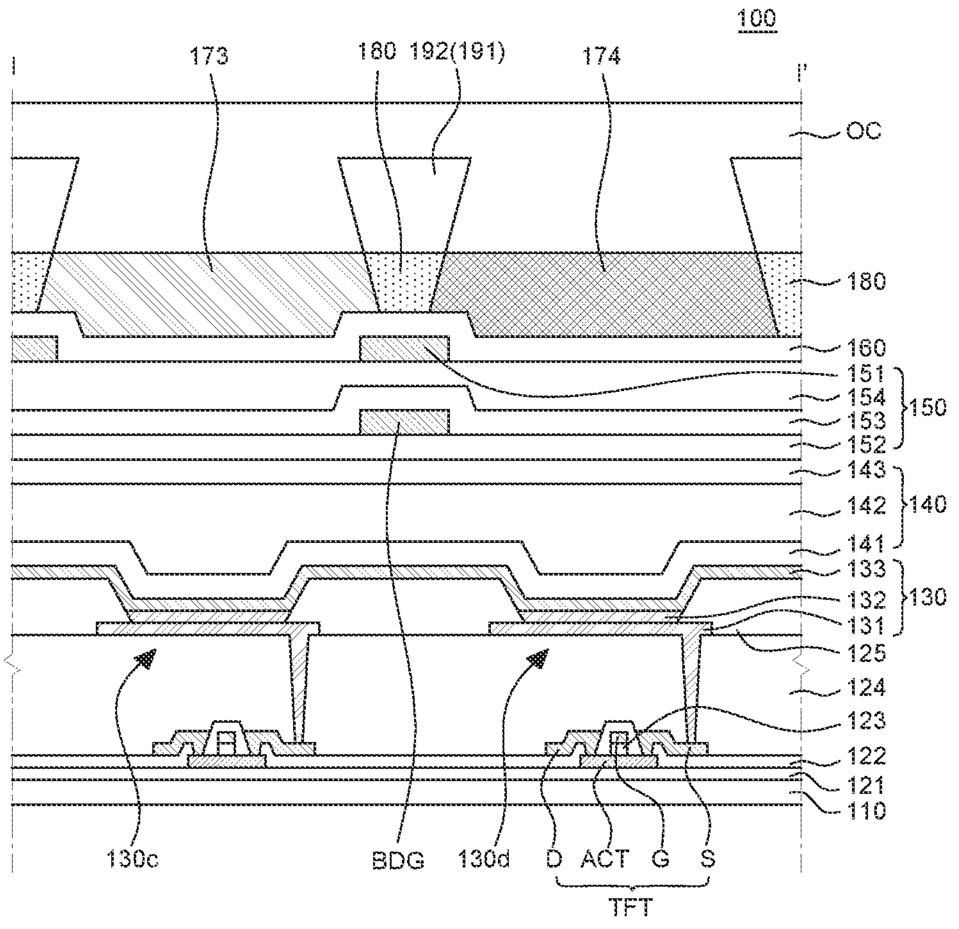
FIG. 3 is a cross-sectional view taken along I-I' of FIG. 2.
Figure 4:
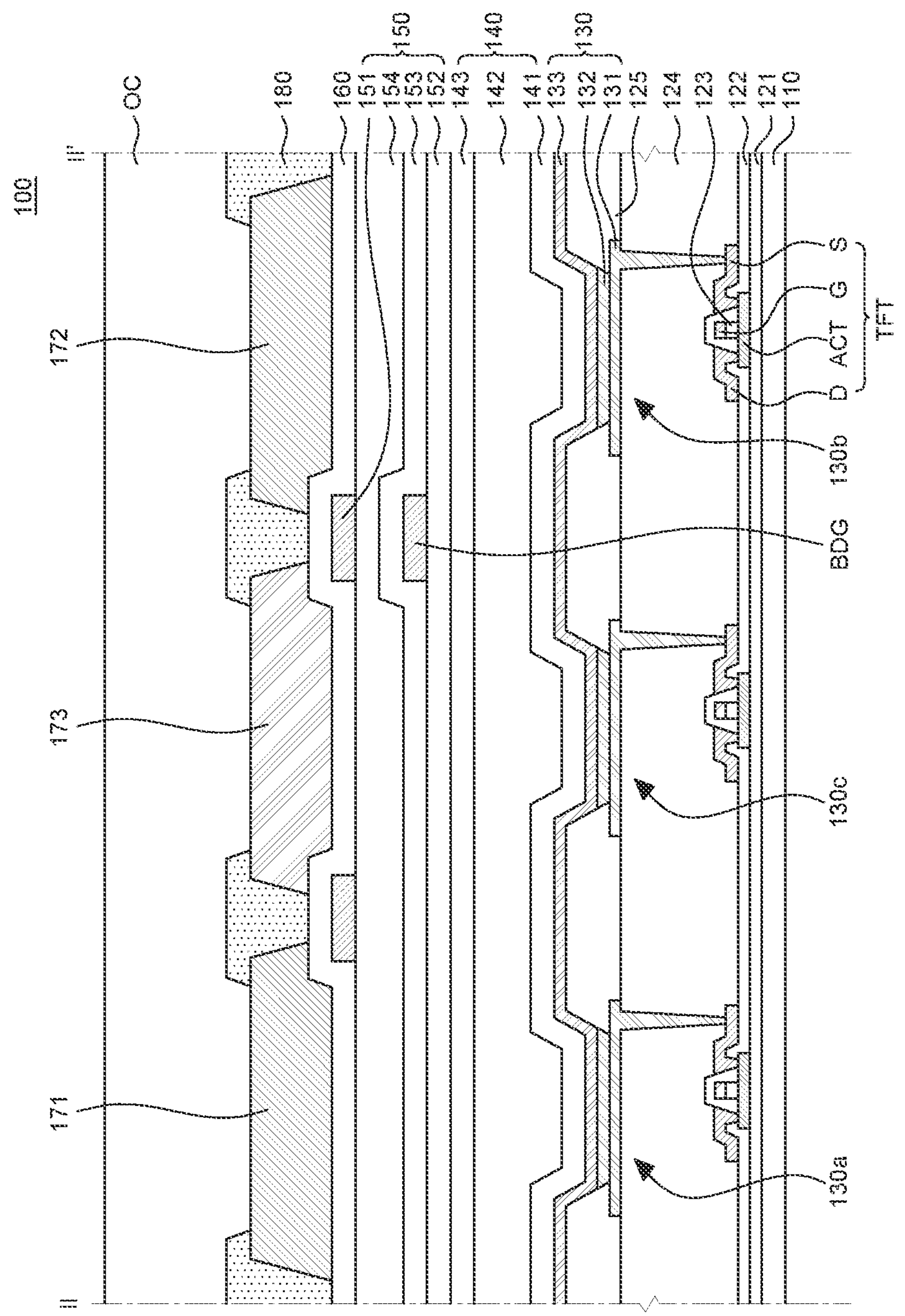
FIG. 4 is a cross-sectional view taken along II-II' of FIG. 2.

FIG. 1 is a plan view of a display device according to an example embodiment of the present disclosure. FIG. 2 is an enlarged plan view of area A of FIG. 1. FIG. 3 is a cross-sectional view taken along I-I' of FIG. 2. FIG. 4 is a cross-sectional view taken along II-II' of FIG. 2.

Referring to FIGS. 1 to 4, a display device 100 according to an example embodiment of the present disclosure includes a substrate 110, organic light emitting elements 130, an encapsulation layer 140, a touch sensor unit 150, color filters 171, 172, 173, and 174, a black matrix 180, spacers 190, and an overcoating layer OC.

The substrate 110 includes areas defined as a display area DA and a non-display area NDA. The display area DA is an area where a plurality of pixels PX are disposed to substantially display an image. The pixels PX including emission areas for displaying an image and driving circuits for driving the pixels PX can be disposed in the display area DA. The non-display area NDA surrounds or are adjacent to the display area DA. The non-display area NDA is an area in which an image is not substantially displayed, and various lines, driver ICs, printed circuit boards, and the like for driving the pixels PX and driving circuits disposed in the display area DA can be disposed in the non-display area NDA.

The plurality of pixels PX can be arranged in a matrix shape, and each of the plurality of pixels PX can include a plurality of sub-pixels SP1, SP2, SP3, and SP4. The sub-pixels SP1, SP2, SP3, and SP4 are elements for displaying one color, respectively, and include an emission area in which light is emitted and a non-emission area in which light is not emitted. For example, each of the plurality of sub-pixels can display any one color among red, green, and blue, but the present disclosure is not limited thereto, as different number of sub-pixels can be used, and other visible colors or wavelengths of light can be displayed or emitted.

For example, one pixel PX can include a first sub-pixel SP1, a second sub-pixel SP2, a third sub-pixel SP3, and a fourth sub-pixel SP4. For example, the first sub-pixel SP1 and the second sub-pixel SP2 are alternately disposed in a first direction (an X-axis direction). The third sub-pixel SP3 and the fourth sub-pixel SP4 are spaced apart from the first sub-pixel SP1 and the second sub-pixel SP2 in a second direction (a Y-axis direction) and are alternately disposed in the first direction (the X-axis direction). The third sub-pixel SP3 and the fourth sub-pixel SP4 are arranged in a zigzag manner with respect to the first sub-pixel SP1 and the second sub-pixel SP2. However, the present disclosure is not limited thereto, and different arrangements of the first through fourth sub-pixels SP1-SP4 can be used, such as all the sub-pixels being arranged linearly along a direction, or arranged in various patterns, such as a diamond pattern.

The first sub-pixel SP1, the second sub-pixel SP2, the third sub-pixel SP3, and the fourth sub-pixel SP4 can display different colors, and some of the sub-pixels can display the same color as needed. For example, the sub-pixels can be arranged in a pentile structure in which each of the first sub-pixel SP1 and the second sub-pixel SP2 is a green sub-pixel, the third sub-pixel SP3 is a blue sub-pixel, and the fourth sub-pixel SP4 is a red sub-pixel. In this example, it can be advantageous in that an opening ratio is improved while maintaining a high resolution, a manufacturing process of the display device is simplified, and power consumption is reduced. However, the present disclosure is not limited thereto.

In the drawings, sizes of the respective sub-pixels SP1, SP2, SP3, and SP4 are illustrated to be equal, but areas of the respective sub-pixels SP1, SP2, SP3, and SP4 can be differently formed in size for respective colors displayed by the sub-pixels SP1, SP2, SP3 and SP4 in consideration of luminance and color temperature. For example, the blue third sub-pixel SP3 can have a larger area than those of the first sub-pixel SP1, the second sub-pixel SP2, and the fourth sub-pixel SP4, but the present disclosure is not limited thereto, and two or three of sub-pixels SP1, SP2, SP3 and SP4 can be of the same size, while the other two or one of the sub-pixels SP1, SP2, SP3 and SP4 are of different sizes. In various embodiments of the present disclosure, a mix of sizes and shapes for the sub-pixels SP1, SP2, SP3 and SP4 is within the scope of the present disclosure.

Each of the sub-pixels SP1, SP2, SP3, and SP4 can have a circular shape, an elliptical shape, or a polygonal shape such as a triangular shape, a quadrangular shape, a pentagonal shape, or a hexagonal shape, but is not particularly limited, and the sub-pixels SP1, SP2, SP3, and SP4 can each have a combination of shapes or different shapes from each other.

The substrate 110 is a substrate for supporting various elements constituting the display device. For example, the substrate 110 can be a glass substrate or a plastic substrate. For example, the plastic substrate can be selected from among polyimide, polyethersulfone, polyethylene terephthalate, and polycarbonate, but the present disclosure is not limited thereto. In the example of using a plastic substrate having flexibility, a support member such as a back plate can be disposed under the substrate 110. Since a plastic substrate having flexibility is relatively thin and less in rigidity compared to a glass substrate, sagging thereof can occur when various elements are disposed. The back plate supports the substrate 110 formed of plastic so that sagging of the substrate 110 does not occur, and protects the display device 100 from moisture, heat, impacts, and the like. For example, the back plate can be formed of a metallic material such as stainless steel (SUS), or can be formed of a plastic material such as polymethylmethacrylate, polycarbonate, polyvinyl alcohol, acrylonitrile-butadiene-styrene, or polyethylene terephthalate. When the back plate is disposed under the substrate 110, an adhesive layer can be disposed between the substrate 110 and the back plate to bond them together. The adhesive layer can be an optical transparent adhesive or a pressure sensitive adhesive, but the present disclosure is not limited thereto, and an opaque adhesive can also be used, either entirely, or partially where transparency is not required.

A substrate buffer layer 121 can be disposed on the substrate 110 to prevent penetration of oxygen or moisture. The substrate buffer layer 121 can be formed as a single layer or can be formed as a multilayer structure if necessary. A thin film transistor TFT including a gate electrode G, an active layer ACT, a source electrode S, and a drain electrode D is disposed on the substrate buffer layer 121. The thin film transistor TFT is disposed in each area of the first sub-pixel SP1, the second sub-pixel SP2, the third sub-pixel SP3, and the fourth sub-pixel SP4. In the drawings, only a driving thin film transistor among various thin film transistors that can be included in the display device 100 is illustrated for convenience of description. Further, in the drawings, it is by example illustrated that the thin film transistor TFT has a coplanar structure, but the present disclosure is not limited thereto, and a thin film transistor TFT having an inverted staggered structure can also be used. For example, the active layer ACT is disposed on the substrate buffer layer 121, and a gate insulating layer 123 for insulating the active layer ACT and the gate electrode G is disposed on the active layer ACT. In addition, an interlayer insulating layer 122 is disposed on the substrate buffer layer 121 to insulate the gate electrode G, and the source electrode S and the drain electrode D. The source electrode S and the drain electrode D that are respectively in contact with the active layer ACT are formed on the interlayer insulating layer 122. A planarization layer 124 can be disposed on the thin film transistor TFT. The planarization layer 124 planarizes an upper portion of the thin film transistor TFT. The planarization layer 124 can include contact holes for electrically connecting the thin film transistors TFT and anodes 131 of the organic light emitting elements 130.

The organic light emitting elements 130 are disposed on the planarization layer 124. The organic light emitting elements 130 include a first organic light emitting element **130*a* disposed in the first sub-pixel SP1, a second organic light emitting element 130*b* disposed in the second sub-pixel SP2, and a third organic light emitting element 130*c* disposed in the third sub-pixel SP3. Each of the organic light emitting elements 130*a*, 130*b*, and 130*c* includes the anode 131, an organic light emitting layer 132, and a cathode 133**.

The anode 131 is disposed on the planarization layer 124. The anode 131 is disposed to correspond to each of the plurality of sub-pixels SP1, SP2, SP3, and SP4. The anode 131 is a component for supplying holes to the organic light emitting layer 132 and is formed of a conductive material having a high work function. The anode 131 can be a transparent conductive layer formed of transparent conductive oxide (TCO). For example, the anode 131 can be formed of at least one selected from among transparent conductive oxides such as indium-tin-oxide (ITO), indium-zinc-oxide (IZO), indium-tin-zinc-oxide (ITZO), tin oxide ($SnO_2$), zinc oxide (ZnO), indium-copper-oxide (ICO) and aluminum-doped ZnO (AZO), but the present disclosure is not limited thereto, and materials other than oxides can be used. When the display device 100 is driven in a top emission mode, the anode 131 can further include a reflective layer to reflect light emitted from the organic light emitting layer 132 toward the cathode 133. The anodes 131 can be formed separately for each of the first sub-pixel SP1, the second sub-pixel SP2, and the third sub-pixel SP3. Banks 125 are disposed on the anodes 131 and the planarization layer 124. The banks 125 are disposed to cover edges of the anodes 131 of the organic light emitting elements 130. For example, the banks 125 can partition the plurality of sub-pixels SP1, SP2, SP3, and SP4. The banks 125 can be formed of an insulating material to insulate the anodes 131 of the sub-pixels SP1, SP2, and SP3 adjacent from one another. In addition, the banks 125 can be configured as black banks having a high light absorption rate to prevent color mixing between the adjacent sub-pixels SP1, SP2, and SP3. For example, the banks 125 can be formed of polyimide resin, acrylic resin, or benzocyclobutene resin, but the present disclosure is not limited thereto, as other organic materials in general can be used.

The cathode 133 is disposed on the anode 131. The cathode 133 can be formed of a metallic material having a low work function to smoothly supply electrons to the organic light emitting layer 132. For example, the cathode 133 can be formed of a metallic material selected from among calcium (Ca), barium (Ba), aluminum (Al), silver (Ag), and alloys containing one or more of them, but the present disclosure is not limited thereto, and other metals or conductive ceramics or oxides can be used. The cathode 133 can be formed as one layer on the anode 131. For example, the cathode 133 can be formed as a single layer in the first sub-pixel SP1, the second sub-pixel SP2, the third sub-pixel SP3, and the fourth sub-pixel SP4. When the display device 100 is driven in the top emission mode, the cathode 133 can be formed to have a very thin thickness and can be substantially transparent.

The organic light emitting layer 132 is disposed between the anode 131 and the cathode 133. The organic light emitting layer 132 is a layer that emits light by combining electrons and holes. Each of the organic light emitting layers of the first organic light emitting element 130*a* and the second organic light emitting element 130*b* can be a green organic light emitting layer, the organic light emitting layer of the third organic light emitting element 130*c* can be a blue organic light emitting layer, and the organic light emitting layer of the fourth organic light emitting element 130*d* can be a red organic light emitting layer.

The organic light emitting element 130 can further include a hole injection layer, a hole transport layer, an electron transport layer, an electron injection layer, and the like to improve luminous efficiency. For example, the hole injection layer and the hole transport layer can be disposed between the anode 131 and the organic light emitting layer 132, and the electron transport layer and the electron injection layer can be disposed between the organic light emitting layer 132 and the cathode 133. In addition, a hole blocking layer or an electron blocking layer can be disposed in the organic light emitting layer 132 to further improve recombination efficiency of holes and electrons.

The encapsulation layer 140 is disposed on the organic light emitting element 130. The encapsulation layer 140 can cover the organic light emitting element 130. The encapsulation layer 140 can protect the organic light emitting element 130 from external moisture, oxygen, impacts, and the like. The encapsulation layer 140 can have a multilayer structure in which an inorganic layer formed of an inorganic insulating material and an organic layer formed of an organic material are stacked. For example, the encapsulation layer 140 can be configured to include at least one organic layer and at least two inorganic layers, and can have a multilayer structure in which the inorganic layer and the organic layer are alternately stacked, but the present disclosure is not limited thereto. For example, the encapsulation layer 140 can have a triple-layer structure including a first inorganic layer 141, an organic layer 142, and a second inorganic layer 143. In this example, each of the first inorganic layer 141 and the second inorganic layer 143 can be independently formed of at least one selected from silicon nitride (SiNx), silicon oxide (SiOx), aluminum oxide (AlOx), and silicon oxynitride (SiON), but the present disclosure is not limited thereto. In addition, the organic layer 142 can be formed of at least one selected from an epoxy resin, polyimide, polyethylene, and silicon oxycarbide (SiOC), but the present disclosure is not limited thereto. In certain instances, a multilayer structure of all organic layers, or all inorganic layers can be used.

The touch sensor unit 150 is disposed on the encapsulation layer 140 to provide a touch sensing function to the display device 100. The display device 100 according to an example embodiment of the present disclosure includes the touch sensor unit 150 having a structure in which touch electrodes 151 are formed on the encapsulation layer 140, other than a structure in which a conventional touch panel having a touch electrode formed on a separate substrate is disposed on an upper portion of an organic light emitting element through an adhesive member. As the touch sensor unit 150 is directly formed on the encapsulation layer 140, an adhesive member for bonding the touch sensor unit 150 and the display panel is omitted, and thus, a thickness of the display device 100 can be reduced.

The touch sensor unit 150 includes a plurality of the touch electrodes 151, a first buffer layer 152, a first touch insulating layer 153, and a second touch insulating layer 154. The first buffer layer 152 is disposed on the second inorganic layer 143. The first buffer layer 152 can be directly disposed on the second inorganic layer 143 to improve adhesion between the touch sensor unit 150 and the second inorganic layer 143. In particular, the first buffer layer 152 can improve adhesion between metal layers such as a bridge electrode BDG and the like and the second inorganic layer 143. The first buffer layer 152 can be disposed on an entire surface of the substrate 110 over the display area DA and the non-display area NDA. Accordingly, when metal layers such as the bridge electrode BDG and the like are formed, the first buffer layer 152 can protect the organic light emitting elements 130 and signal lines or pads disposed in the non-display area NDA to drive the organic light emitting elements 130, from being damaged.

The first buffer layer 152 can be formed of an inorganic insulating material, for example, at least one selected from silicon nitride (SiNx), silicon oxide (SiOx), aluminum oxide (AlOx), and silicon oxynitride (SiON), but the present disclosure is not limited thereto, and other inorganic layers such as carbides can also be used, as well as cations of other metals or elements.

The touch electrodes 151 are electrodes that sense a touch input and can be configured with a sensing electrode and a driving electrode, and detect touch coordinates by detecting a change in capacitance between the electrodes. For example, the sensing electrode and the driving electrode are disposed on the same plane, and at least some of a plurality of the touch electrodes can be electrically connected through the bridge electrode BDG disposed on a plane different from that of the touch electrodes with an insulating layer interposed therebetween. Specifically, for example, the bridge electrode BDG can be disposed on the first buffer layer 152, at least one or more touch insulating layers 153 and 154 can be disposed to cover the bridge electrode BDG, and the plurality of touch electrodes 151 can be disposed on the touch insulating layers 153 and 154. The bridge electrode BDG can be configured to be electrically connected to at least some of the plurality of touch electrodes 151. To this end, the touch insulating layers 153 and 154 can include contact holes. However, the present disclosure is not limited thereto, and a configuration of the touch sensor unit 150 can be variously changed as needed, such as having additional layers.

Each of the plurality of touch electrodes 151 can be disposed to correspond to a boundary of the sub-pixels. Each of the plurality of touch electrodes 151 can be disposed on the touch insulating layers 153 and 154 to overlap the bank 125. In this example, efficiency of light emitted from the organic light emitting element 130 can be maintained high without being lowered. The touch electrodes 151 can be disposed on the touch insulating layers 153 and 154 to correspond to spaces between the color filters 171, 172, 173, and 174. The touch electrodes 151 can be disposed on the touch insulating layers 153 and 154 to correspond to the black matrix 180. For example, at least portions of the touch electrodes 151 are covered or overlapped by the black matrix 180 and are not visible from the outside. Accordingly, degradation in display quality due to the visible recognition of the touch electrodes 151 can be minimized. However, the present disclosure is not limited thereto, and an arrangement structure of the touch electrodes 151 can be changed as needed.

The touch electrodes 151 can be formed of a transparent metallic material such as indium-tin-oxide (ITO) or indium-zinc-oxide (IZO) capable of transmitting light. The touch electrodes 151 can have various shapes such as a rectangular shape, an octagonal shape, a circular shape, or a rhombus shape, but the present disclosure is not limited thereto as the touch electrodes 151 can be a matrix shape, for example. The touch insulating layers 153 and 154 can be formed of an inorganic insulating material or an organic insulating material, and can have a multilayer structure in which a layer formed of an inorganic insulating material and a layer formed of an organic insulating material are alternately disposed. For example, the touch insulating layers can include a second touch insulating layer 154 that is formed of an inorganic insulating material, disposed on the first touch insulating layer 153 and the first touch insulating layer 153 disposed to cover the bridge electrode BDG, and formed of an organic insulating material.

For example, the first touch insulating layer 153 can be formed of at least one inorganic insulating material selected from among silicon nitride (SiNx), silicon oxide (SiOx), aluminum oxide (AlOx), and silicon oxynitride (SiON), but is not limited thereto, and other inorganic layers such as carbides can also be used, as well as cations of other metals or elements.

For example, the second touch insulating layer 154 can be formed of a transparent organic insulating material such as acrylic resin, polyester resin, epoxy resin, silicone resin or the like, but the present disclosure is not limited thereto.

A second buffer layer 160 is disposed to cover the plurality of touch electrodes 151. The second buffer layer 160 protects the touch sensor unit 150 from being damaged during a process of forming the color filters 171, 172, 173, and 174 and the black matrix 180 disposed above the touch sensor unit 150. In addition, the second buffer layer 160 prevents penetration of moisture or oxygen from the outside to protect the touch sensor unit 150 from being deteriorated. The second buffer layer 160 can be formed of an inorganic insulating material having excellent barrier properties. For example, the second buffer layer 160 can be formed of at least one inorganic insulating material selected from among silicon nitride (SiNx), silicon oxide (SiOx), aluminum oxide (AlOx), and silicon oxynitride (SiON), but the present disclosure is not limited thereto, and other inorganic materials such as carbides can also be used, as well as cations of other metals or elements. In addition, the second buffer layer 160 can compensate for a decrease in adhesion between the plurality of color filters 171, 172, 173, and 174 and the black matrix 180, and the touch sensor unit 150. For example, the second buffer layer 160 is disposed on the touch sensor unit 150 so that the plurality of color filters 171, 172, 173, and 174, the black matrix 180, and the touch sensor unit 150 can be bonded to each other.

The plurality of color filters 171, 172, 173, and 174 and the black matrix 180 are disposed on the second buffer layer 160. The plurality of color filters 171, 172, 173, and 174 and the black matrix 180 absorb external light while maintaining high luminance of light emitted from the organic light emitting element 130 to thereby serve as an anti-reflection layer that minimizes a decrease in visibility and contrast ratio of the display device 100 due to the external light. The plurality of color filters 171, 172, 173, and 174 are disposed on the second buffer layer 160 to correspond to the sub-pixels disposed therebelow. The respective color filters 171, 172, 173, and 174 do not come into contact with one another at boundaries of the sub-pixels, and are independently disposed to correspond to each of the sub-pixels. Each of the color filters 171, 172, 173, and 174 can correspond to a color of each of the sub-pixels corresponding thereto. For example, the plurality of color filters 171, 172, 173, and 174 include a first color filter 171 corresponding to the first sub-pixel SP1, a second color filter 172 corresponding to the second sub-pixel SP2, a third color filter 173 corresponding to the third sub-pixel SP3, and a fourth color filter 174 corresponding to the fourth sub-pixel SP4.

The first color filters 171 and the second color filters 172 are alternately disposed in the first direction (the X-axis direction). The third color filters 173 and the fourth color filters 174 can be disposed to be spaced apart from the first color filters 171 and the second color filters 172 in the second direction (the Y-axis direction), and alternately disposed in the first direction (the X-axis direction). The third color filters 173 and the fourth color filters 174 are disposed in a zigzag manner with the first color filters 171 and the second color filters 172. However, the present disclosure is not limited thereto.

When the first sub-pixel SP1 and the second sub-pixel SP2 are green sub-pixels, the first color filter 171 and the second color filter 172 are green color filters. When the third sub-pixel SP3 is a blue sub-pixel, the third color filter 173 is a blue color filter. When the fourth sub-pixel SP4 is a red sub-pixel, the fourth color filter 174 is a red color filter. Accordingly, the first color filter 171 and the second color filter 172 transmit green light. Here, a wavelength of the green light can be about 495 nm to about 570 nm, but the present disclosure is not limited thereto. The third color filter 173 transmits blue light. Here, a wavelength of the blue light can be about 440 nm to about 495 nm, but the present disclosure is not limited thereto. The fourth color filter 174 transmits red light. Here, a wavelength of the red light can be about 620 nm to about 750 nm, but the present disclosure is not limited thereto.

Each of the color filters 171, 172, 173, and 174 includes a transparent base resin and a color-development material. For example, the transparent base resin can be one selected from polyacrylate, polymethyl methacrylate, polyimide, polyvinyl alcohol, polyethylene, polypropylene, polystyrene, polyethylene terephthalate, and the like, but the present disclosure is not limited thereto, as other resins would be available for use as a transparent base resin. The color-development material absorbs light in a specific wavelength band and transmits light in remaining wavelength bands. For example, the red color filter includes a red color-development material that transmits light in a red wavelength band and absorbs light in green and blue wavelength bands. For example, the red color-development material can be a phenylene-based compound or a diketo-pyrrolopyrrole-based compound. For example, the green color-development material can be a phthalocyanine-based compound. For example, the blue color-development material can be a copper phthalocyanine-based compound or an anthraquinone-based compound. However, the color-development material is not limited thereto, and any material that transmits light in red, blue, and green wavelength bands can be used without limitation. As each of the color filters 171, 172, 173, and 174 is disposed to correspond to the color of each of the sub-pixels SP1, SP2, SP3, and SP4 corresponding thereto, internal light emitted from each of the first sub-pixel SP1, the second sub-pixel SP2, the third sub-pixel SP3, and the fourth sub-pixel SP4 passes through the color filters 171, 172, 173, and 174. For example, green light emitted from the first sub-pixel SP1 passes through the first color filter 171. On the other hand, when external light is incident, the external light corresponding to an absorption wavelength of the color-development material included in each of the color filters 171, 172, 173, and 174 is absorbed by the color filter 171, 172, 173, or 174. External light not absorbed by the color filter 171, 172, 173, or 174 is reflected by the cathode 133 and passes through the color filter 171, 172, 173, or 174 again. Reflected light corresponding to the absorption wavelength of the color-development material included in each of the color filters 171, 172, 173, and 174 is absorbed by the color filter 171, 172, 173, or 174. Accordingly, degradation of display quality due to the external light can be minimized.

The black matrix 180 is disposed on the second buffer layer 160 to partition the plurality of color filters 171, 172, 173, and 174. The black matrix 180 partitions each of the plurality of color filters 171, 172, 173, and 174. The black matrix 180 is disposed in the boundaries of the sub-pixels and includes openings exposing the sub-pixels. The black matrix 180 can be disposed to overlap the banks 125. The black matrix 180 is disposed to fill openings between the color filters 171, 172, 173, and 174 adjacent to one another. Accordingly, the black matrix 180 is disposed to completely cover side surfaces of each of the color filters 171, 172, 173, and 174. Accordingly, the black matrix 180 can minimize color mixing between the sub-pixels SP1, SP2, SP3, and SP4. Further, the black matrix 180 absorbs external light. Accordingly, degradation in visibility and contrast ratio of the display device 100 due to external light can be minimized. As described above, the plurality of touch electrodes 151 are disposed to overlap the black matrix 180, and the black matrix 180 can prevent the plurality of touch electrodes 151 from being visible.

In the drawings, it is illustrated that upper surfaces of the black matrix 180 and the color filters 171, 172, 173, and 174 coincide with each other, but the present disclosure is not limited thereto. The upper surface of the black matrix 180 can be lower or higher than the upper surfaces of the color filters 171, 172, 173, and 174.

The black matrix 180 includes a base resin and a black material. The base resin can be at least one selected from cardo-based resin, epoxy-based resin, acrylate-based resin, siloxane-based resin, and polyimide, but the present disclosure is not limited thereto, as other resins would be available for use as a base resin. The black material can be a black pigment selected from among a carbon-based pigment, a metal oxide-based pigment, and an organic-based pigment. For example, the carbon-based pigment can be carbon black. For example, the metal oxide-based pigment can include titanium black (TiNxOy) and Cu—Mn—Fe-based black pigments, but the present disclosure is not limited thereto. For example, the organic-based pigment can be selected from among lactam black, perylene black, and aniline black, but the present disclosure is not limited thereto. In addition, an RGB black pigment including a red pigment, a blue pigment, and a green pigment can be used as the black material, but the present disclosure is not limited thereto, since various color combination can provide a black color when mixed together.

A plurality of the spacers 190 are respectively disposed on the black matrix 180. The respective spacers 190 are disposed to correspond to the plurality of touch electrodes 151. The respective spacers 190 can overlap the banks 125. The respective spacers 190 are disposed on the black matrix 180 to be positioned between the color filters 171, 172, 173, and 174 adjacent to one another. The respective spacers 190 are disposed between the color filters 171, 172, 173, and 174 adjacent to one another in the first direction (the X-axis direction) and the second direction (the Y-axis direction). However, the present disclosure is not limited thereto. As another example, the spacers 190 can be disposed between the color filters 171, 172, 173, and 174 adjacent in a diagonal direction between the first direction (the X-axis direction) and the second direction (the Y-axis direction).

The spacers 190 increase a surface area of a surface in contact with the overcoating layer OC. Accordingly, adhesion of an interface where the color filters 171, 172, 173, and 174 and the black matrix 180 come into contact with the overcoating layer OC is improved, so that folding characteristics can be improved. Thus, when the display device 100 is folded or bent, a defect of causing cracks or delamination in the overcoating layer OC can be solved.

The spacers 190 can prevent a moiré phenomenon that degrades display quality, such as rainbow moiré. The plurality of color filters 171, 172, 173, and 174 disposed above the organic light emitting elements 130 are formed to have a larger area than that of the emission areas of the organic light emitting elements 130 in order to secure a viewing angle. For example, each of the color filters 171, 172, 173, and 174 is formed to have a larger area than an area of the anode 131 exposed by the bank 125. In this example, the moiré phenomenon can be caused by interference of light due to mutual interference between a regular pattern shape of the color filters and regularly arranged anodes. By this moiré phenomenon, image quality characteristics are affected, and a continuous pattern phenomenon can remain to cause defects in visibility. The moiré phenomenon is exhibited as a rainbow moiré phenomenon under external light, thereby further lowering visibility. An irregular pattern can be provided by forming the spacers 190 between the adjacent color filters 171, 172, 173, and 174, so that the moiré phenomenon can be prevented.

For example, the plurality of spacers 190 include a plurality of horizontal spacers 191 and a plurality of vertical spacers 192. The plurality of horizontal spacers 191 and the plurality of vertical spacers 192 can be disposed in the first direction (the X-axis direction) and the second direction (the Y-axis direction), respectively. The horizontal spacers 191 are disposed between the first color filters 171 and the second color filters 172 that are alternately disposed in the first direction (the X-axis direction). The horizontal spacers 191 can be positioned between the third color filters 173 adjacent to each other in the second direction (the Y-axis direction) and between the fourth color filters 174 adjacent to each other in the second direction (the Y-axis direction). The vertical spacers 192 are disposed between the third color filters 173 and the fourth color filters 174 that are alternately disposed in the first direction (the X-axis direction). The vertical spacers 192 can be positioned between the first color filters 171 adjacent to each other in the second direction (the Y-axis direction) and between the second color filters 172 adjacent to each other in the second direction (the Y-axis direction).

The horizontal spacers 191 and the vertical spacers 192 can have a rectangular shape on a plane. However, the present disclosure is not limited thereto. As another example, each of the spacers 190 can have a polygonal shape such as a quadrangular shape or a trapezoidal shape, a circular shape, an elliptical shape, or a crescent shape on a plane.

The horizontal spacer 191 can be elongated in the first direction (the X-axis direction) and interposed between the first color filter 171 and the second color filter 172. For example, the horizontal spacer 191 can have a rectangular shape in which a length of a side in a horizontal direction is greater than a length of a side in a vertical direction on a plane. The vertical spacer 192 can be elongated in the second direction (the Y-axis direction) and interposed between the third color filter 173 and the fourth color filter 174. For example, the vertical spacer 192 can have a rectangular shape in which a length of a side in the vertical direction is greater than a length of a side in the horizontal direction on a plane. When the horizontal spacer 191 and the vertical spacer 192 are provided as described above, it is advantageous in terms of excellent folding characteristics regardless of a direction of a folding axis. For example, even when the display device 100 is folded in the X-axis direction or the Y-axis direction, the folding characteristics are excellent.

Each of the spacers 190 has a reverse tapered shape in cross-sectional view, although the present disclosure is not limited thereto. For example, each of the spacers 190 has a reversed trapezoidal shape in cross-sectional view. In this example, a surface area at the interface between the color filters 171, 172, 173, and 174 and the black matrix 180 and the overcoating layer OC is greatly increased, so that adhesion between the color filters 171, 172, 173, and 174 and the black matrix 180 and the overcoating layer OC is further improved. Accordingly, folding characteristics can be satisfied in a folding reliability evaluation in which the display device is folded under high temperature and high humidity conditions. Therefore, when the display device 100 is bent or folded, the occurrence of cracks or delamination in the overcoating layer OC can be minimized. In various embodiments of the present disclosure, the spacers 190 can be a structure that has a first end with a first width and second end with a second width, where the first width and the second width have different lengths in the cross-sectional view. In examples where the top surface as the first end having the first width that is greater than the bottom surface as the second end having the second width, provided is the reversed trapezoidal shape in the cross-sectional view shown in FIG. 3, for example. Meanwhile, the present disclosure is not limited to the reversed trapezoidal shape, but can include a shape that has the top surface as the first end having the first width and the bottom surface as the second end having the second width, where the first is about the same as the second width, or even equal to the second width. Also, the width of the spacers in going from the top surface to the bottom surface need not be constant but can vary. For example, when first width of the first end and the second width of the second end are about the same or equal, a middle portion of the spacers 190 connecting the first end and the second end can have a width that is less than at least one of the first end and the second end, or can have a width that is greater than at least one of the first end and the second end. In other embodiments of the present disclosure, the width of the middle portion can vary to include at least one of a greater width, equal width, and lesser width than that of at least one of the first end and the second end. But the present disclosure is not limited thereto.

The spacer 190 can be integrally formed with the black matrix 180. For example, an upper width of the black matrix 180 and a lower width of the spacer 190 can be equal to each other, and the upper width of the black matrix 180 and the lower width of the spacer 190 can completely overlap each other. Accordingly, the black matrix 180 and the spacer 190 can be formed in a single reverse trapezoidal shape in cross-sectional view. For example, a height of the spacer 190 can be 1 μm to 5 μm or 2 μm to 3 μm, but the present disclosure is not limited thereto. However, within this range, since the surface area of the interface in contact with the overcoating layer OC is sufficiently widened, delamination of or damage to the overcoating layer OC can be minimized during folding, and the thickness of the display device 100 can be kept thin.

For example, a taper angle of the spacer 190 can be 20° to 45°, but the present disclosure is not limited thereto. However, delamination of or damage to the overcoating layer OC can be minimized during folding within this range. In this example, the taper angle is an external angle between the upper surface of the black matrix 180 and a side surface of the spacer 190. In various embodiments of the present disclosure, the taper angle of the spacer 190 can range from 0° to 70°, where examples of the taper angle can be 0° to 60°, 20° to 60°, as well as 20° to 45°.

The plurality of spacers 190 include a base resin and a black material. The base resin can be at least one selected from among cardo-based resin, epoxy-based resin, acrylate-based resin, siloxane-based resin, and polyimide, but the present disclosure is not limited thereto. The black material can be a black pigment selected from among a carbon-based pigment, a metal oxide-based pigment, and an organic-based pigment. For example, the carbon-based pigment can be carbon black. For example, the metal oxide-based pigment can include titanium black (TiNxOy) and Cu—Mn—Fe-based black pigments, but the present disclosure is not limited thereto. For example, the organic-based pigment can be selected from among lactam black, perylene black, and aniline black, but the present disclosure is not limited thereto. In addition, an RGB black pigment including a red pigment, a blue pigment, and a green pigment can be used as the black material, but the present disclosure is not limited thereto. Accordingly, the spacers 190 can increase the surface area and improve adhesion to the overcoating layer OC, thereby improving folding characteristics. In addition, the spacers 190 can absorb external light to thereby minimize degradation in visibility and contrast ratio caused by the external light, and can prevent the moiré phenomenon that lowers display quality, such as rainbow moiré.

The spacers 190 can be formed of the same material as the black matrix 180. More preferably, the spacers 190 can be integrally formed of the same material as the black matrix 180. In this example, it is advantageous in that a process cost and a material cost can be reduced because process steps and materials are simplified.

For example, the color filters 171, 172, 173, and 174, the black matrix 180, and the spacers 190 can be formed through the following process. However, this is merely by example, and the process of forming the color filters 171, 172, 173, and 174, the black matrix 180, and the spacers 190 is not limited thereto.

First, a surface of the second buffer layer 160 on which the color filters 171, 172, 173, and 174 and the black matrix 180 are to be formed is cleaned. On the second buffer layer 160, a red color filter is formed to correspond to the red sub-pixel, a blue color filter is formed to correspond to the blue sub-pixel, and a green color filter is formed to correspond to the green sub-pixel in sequence. In this example, the sequence of forming the red color filter, the blue color filter, and the green color filter can be changed. Each of the red color filter, the blue color filter, and the green color filter can be formed through a photoresist process. After the color filters 171, 172, 173, and 174 are formed, the surface is cleaned.

Next, a composition including a base resin and a black material is entirely coated on the color filters 171, 172, 173, and 174. In this example, the composition is coated thick enough to integrally form the black matrix 180 and the spacer 190.

Next, the coated composition is pre-baked.

Next, after performing light exposure thereon using a mask, development thereof is conducted. As the composition is coated thickly and then exposed to light, a surface portion of a coating layer is overcured compared to a lower portion thereof. Accordingly, a pattern is formed in a reverse taper shape during development.

Next, a post-bake is performed to form the black matrix 180 and the spacers 190. As described above, since the lower portion has a lower degree of cure than the surface portion, an etch degree of the lower portion is greater than that of the surface portion during development. Accordingly, as illustrated in FIG. 3, the black matrix 180 and the spacer 190 can be integrally formed to have a single inverted trapezoidal shape.

A method of manufacturing the black matrix 180 and the spacers 190 has only been described by taking a more advantageous method in terms of the process as an example, but the manufacturing method of the black matrix 180 and the spacers 190 is not limited to the aforementioned method. According to needs or design structures, the black matrix 180 and the spacers 190 can be formed in separate processes using different masks.

The overcoating layer OC is disposed to cover the plurality of spacers, the plurality of color filters 171, 172, 173, and 174 and the black matrix 180. In the display device 100 of the present disclosure, the surface area of the surface on which the overcoating layer OC is disposed is wide due to the plurality of spacers 190 disposed on the black matrix 180, so that the adhesion of the overcoating layer OC can be greatly improved. Accordingly, when the display device 100 is bent or folded, occurrence of cracks or delamination in the overcoating layer OC can be minimized.

The overcoating layer OC can be formed to a thickness sufficient to cover the plurality of spacers, the plurality of color filters 171, 172, 173, and 174 and the black matrix 180. For example, the overcoating layer OC can have a thickness of 2.5 μm to 7 μm or 3 μm to 5 μm, but the present disclosure is not limited thereto. However, within this range, the thickness of the display device 100 is not greatly increased while the plurality of spacers, the plurality of color filters 171, 172, 173, and 174 and the black matrix 180 can be sufficiently covered, and folding stress can be easily alleviated when the display device is folded, but the embodiments of the present disclosure can include a thickness less than 2.5 μm to a thickness greater than 7 μm.

For example, the overcoating layer OC can be formed of a transparent resin such as acrylic resin, silicone resin, polyester resin, or epoxy resin, but the present disclosure is not limited thereto. The overcoating layer OC can include a UV blocker or UV absorber that blocks or absorbs light having a wavelength of 400 nm or less. Accordingly, it is possible to block light of an ultraviolet wavelength from external light. UV blockers or UV absorbers can be used without limitation as long as they are materials used in the art. In the display device 100 according to an example embodiment of the present disclosure, the surface area of the interface in contact with the overcoating layer OC is increased by the spacers 190 disposed on the black matrix 180, so that the occurrence of delamination or cracks in the overcoating layer OC during bending or folding can be minimized. In addition, effects of improving display quality are provided by minimizing the moiré effect caused by the color filters 171, 172, 173, and 174.

Figure 5:
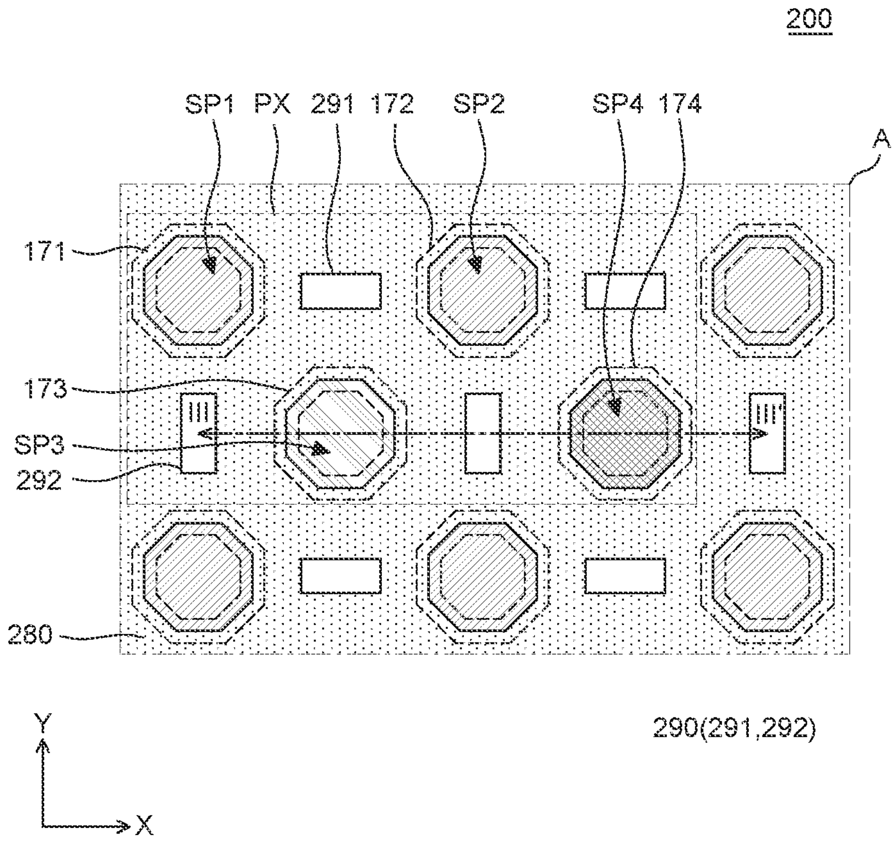
FIG. 5 is an enlarged plan view of a partial area of a display device according to another example embodiment of the present disclosure.
Figure 6:
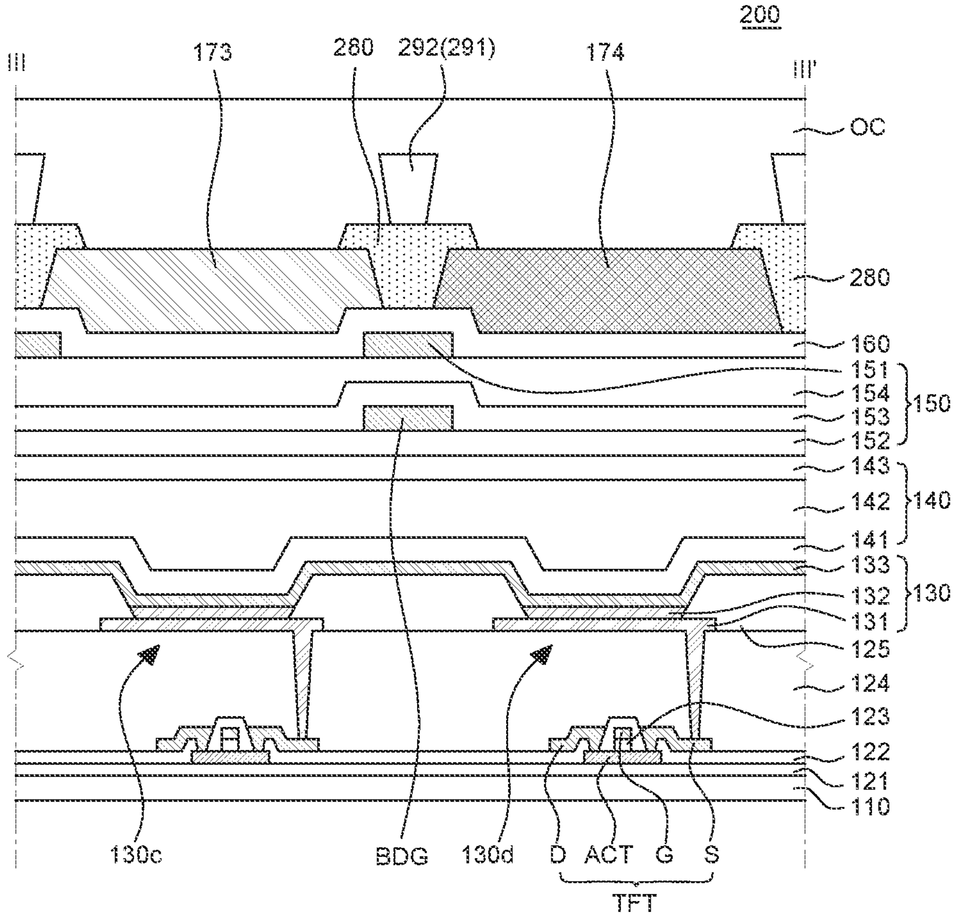
FIG. 6 is a cross-sectional view taken along III-III' of FIG. 5.

FIG. 5 is an enlarged plan view of a partial area of a display device according to another example embodiment of the present disclosure. FIG. 6 is a cross-sectional view taken along III-III' of FIG. 5. Other components of a display device 200 illustrated in FIGS. 5 and 6 are substantially identical to those of the display device 100 illustrated in FIGS. 1 to 4, except for structures of a black matrix and spacers. Accordingly, redundant descriptions of the same components will be omitted.

Referring to FIGS. 5 and 6, a black matrix 280 is disposed to cover at least portions of the upper surfaces of the color filters 171, 172, 173, and 174. The black matrix 280 covers edges of the upper surfaces of the color filter 171, 172, 173, and 174. For example, the black matrix 280 can be disposed to completely cover the side surfaces of the color filters 171, 172, 173, and 174 and the edges of the color filter 171, 172, 173, and 174 by filling the openings between the color filters 171, 172, 173, and 174 adjacent to one another. Accordingly, color mixing between the sub-pixels SP1, SP2, SP3, and SP4 and reflection of external light can be further suppressed.

A plurality of spacers 290 are disposed on the black matrix 280. Each of the spacers 290 has a reverse tapered shape in a cross-sectional view. For example, each of the spacers 290 has a reverse trapezoidal shape in the cross-sectional view.

Each of a lower width and an upper width of the spacer 290 can be smaller than an upper width of the black matrix 280. The black matrix 280 and the plurality of spacers 290 in this structure further increase a surface area in contact with the overcoating layer OC, thereby further improving interfacial adhesion. Accordingly, when the display device 200 is bent or folded, occurrence of cracks or delamination in the overcoating layer OC can be minimized, and the display device 200 with more excellent folding reliability is provided.

Considering convenience and costs of the process, the spacers 290 can be integrally formed of the same material as the black matrix 280. As a result, process steps and materials are simplified, and a process cost and a material cost can be reduced.

For example, the black matrix 280 and the spacers 290 having the same structure as in the present example embodiment can be formed through the following process. Since the process of forming the color filters 171, 172, 173, and 174 is the same as that described for the display device 100 illustrated in FIGS. 1 to 4, redundant descriptions will be omitted.

After the color filters 171, 172, 173, and 174 are formed in the manner described above, a composition including a base resin and a black material is entirely coated on the color filters 171, 172, 173, and 174. In this example, the composition is coated thick enough to integrally form the black matrix 280 and the spacers 290.

Next, the coated composition is pre-baked.

Next, after performing primary exposure thereon using a halftone mask, primary development is performed. As the composition is coated thickly and then exposed to light using a halftone mask, a surface portion of a coating layer is overcured compared to a lower portion thereof.

Next, secondary exposure is performed using a mask. During the secondary exposure, the exposure is performed by increasing intensity of light compared to a primary exposure process so that the lower portion having a lower degree of cure compared to the surface portion can be sufficiently cured.

Next, secondary development and post-bake are performed to form the black matrix 280 and the spacers 290. As the secondary exposure is performed using a general mask after performing the primary exposure using a halftone mask, each of the lower width and the upper width of the spacer 290 can be formed to be smaller than the upper width of the black matrix 280, as illustrated in FIG. 6. In addition, since the lower portion has a lower degree of cure than the surface portion, an etch degree of the lower portion is greater than that of the surface portion during development. Accordingly, the spacer 290 having a reverse tapered structure on the black matrix 280 can be formed integrally with the black matrix 280. However, a method of manufacturing the black matrix 280 and the spacers 290 is not limited thereto. The manufacturing method has been described by taking a more advantageous method in terms of the process as an example, but the black matrix 280 and the spacers 290 can be selectively formed by separate processes using different masks, if necessary. (this is what happened in FIG. 6, compared to FIG. 4).

In the display device 200 according to another example embodiment of the present disclosure, a surface area of an interface in contact with the overcoating layer OC is further increased by the spacers 290 disposed on the black matrix 280, so that occurrence of cracks or delamination in the overcoating layer OC can be more suppressed. In addition, since the black matrix 280 and the spacers 290 are formed in a more irregular arrangement structure than that of the display device 100 illustrated in FIGS. 1 to 4, the moiré phenomenon caused by the color filters 171, 172, 173, and 174 can be further reduced. Accordingly, effects of more excellent display quality and folding reliability are provided.

Figure 7:
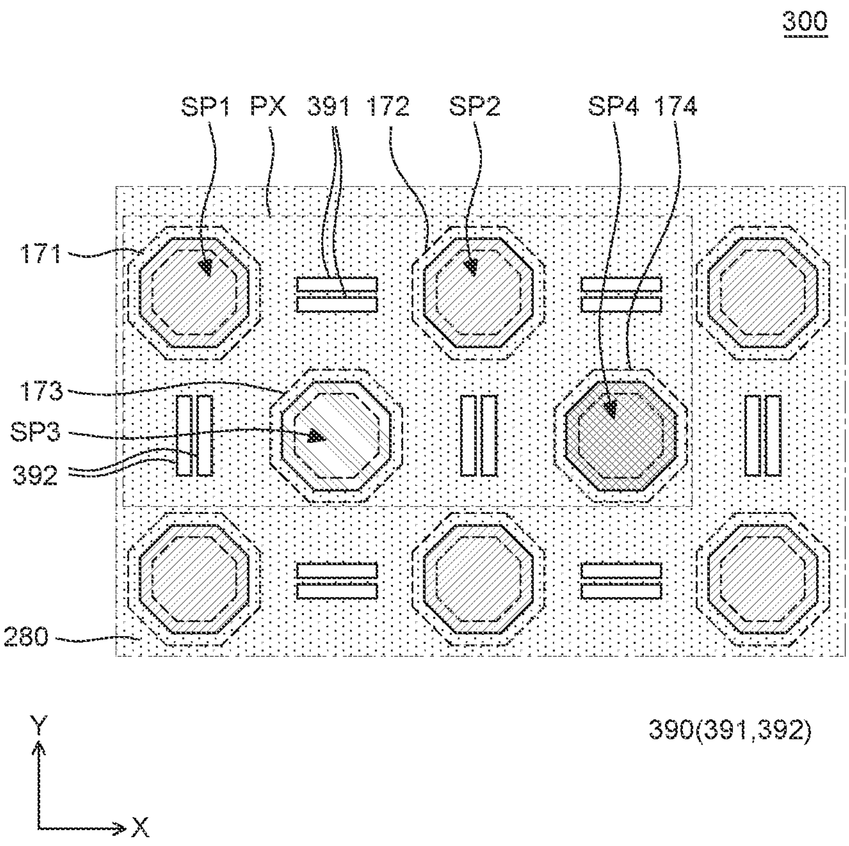
FIG. 7 is an enlarged plan view of a partial area of a display device according to still another example embodiment of the present disclosure.

FIG. 7 is an enlarged plan view of a partial area of a display device according to still another example embodiment of the present disclosure. Other components of a display device 300 illustrated in FIG. 7 are substantially identical to those of the display device 200 illustrated in FIGS. 5 and 6, except for a shape and the number of spacers. Accordingly, redundant descriptions of the same components will be omitted.

Spacers 390 include horizontal spacers 391 and vertical spacers 392. The horizontal spacer 391 and the vertical spacer 392 can have a rectangular shape on a plane. The horizontal spacer 391 and the vertical spacer 392 of the display device 300 illustrated in FIG. 5 have short sides that are relatively short in length compared to the horizontal spacer 191 and the vertical spacer 192 of the display device 100 illustrated in FIGS. 1 to 4, and thus have a rectangular shape close to a bar shape.

The horizontal spacers 391 are disposed between the first color filters 171 and the second color filters 172 that are alternately disposed in the first direction (the X-axis direction). Two horizontal spacers 391 are disposed between the first color filter 171 and the second color filter 172 adjacent to each other. For example, one first color filter 171, two horizontal spacers 391, and one second color filter 172 are alternately disposed in the first direction (the X-axis direction).

The vertical spacers 392 are disposed between the third color filters 173 and the fourth color filters 174 that are alternately disposed in the first direction (the X-axis direction). Two vertical spacers 392 are disposed between the third color filter 173 and the fourth color filter 174 adjacent to each other. For example, one third color filter 173, two vertical spacers 392, and one fourth color filter 174 are alternately disposed in the first direction (the X-axis direction).

In the example embodiment, it is described that two spacers 390 are disposed between the adjacent color filters 171, 172, 173, and 174 by way of example, but the present disclosure is not limited thereto, and three or more spacers can be disposed therebetween.

Each of the two horizontal spacers 391 disposed between the first color filter 171 and the second color filter 172 adjacent to each other can be elongated in the first direction (the X-axis direction). For example, the horizontal spacer 391 can have a rectangular (bar) shape in which a length of a side in a horizontal direction is greater than a length of a side in a vertical direction on a plane. Each of the two vertical spacers 392 disposed between the third color filter 173 and the fourth color filter 174 adjacent to each other can be elongated in the second direction (the Y-axis direction). For example, the vertical spacer 392 can have a rectangular (bar) shape in which a length of a side in the vertical direction is greater than a length of a side in the horizontal direction on a plane.

The display device 300 according to another example embodiment of the present disclosure has advantages of having a wider surface area by disposing a plurality of bar-shaped spacers 390 that are larger in numbers and are slimmer than those of the display device 100 illustrated in FIGS. 1 to 4. Accordingly, the surface area of the interface in contact with the overcoating layer is wider, and folding characteristics can be further improved. In addition, as the two spacers 390 are disposed between the adjacent color filters 171, 172, 173, and 174, a more irregular pattern can be provided and the moiré phenomenon can be further prevented. In addition, the horizontal spacers 391 arranged in the first direction (the X-axis direction) have a rectangular shape extending in the first direction, and the vertical spacers 392 arranged in the second direction (the Y-axis direction) have a rectangular shape extending in the second direction. Thus, the horizontal spacers 391 and the vertical spacers 392 have only a difference in terms of extending directions thereof, but have substantially the same rectangular shape. Accordingly, regardless of a folding direction, equal tensile stress and compressive stress are applied thereto, so that folding characteristics can be more excellent.

Figure 8:
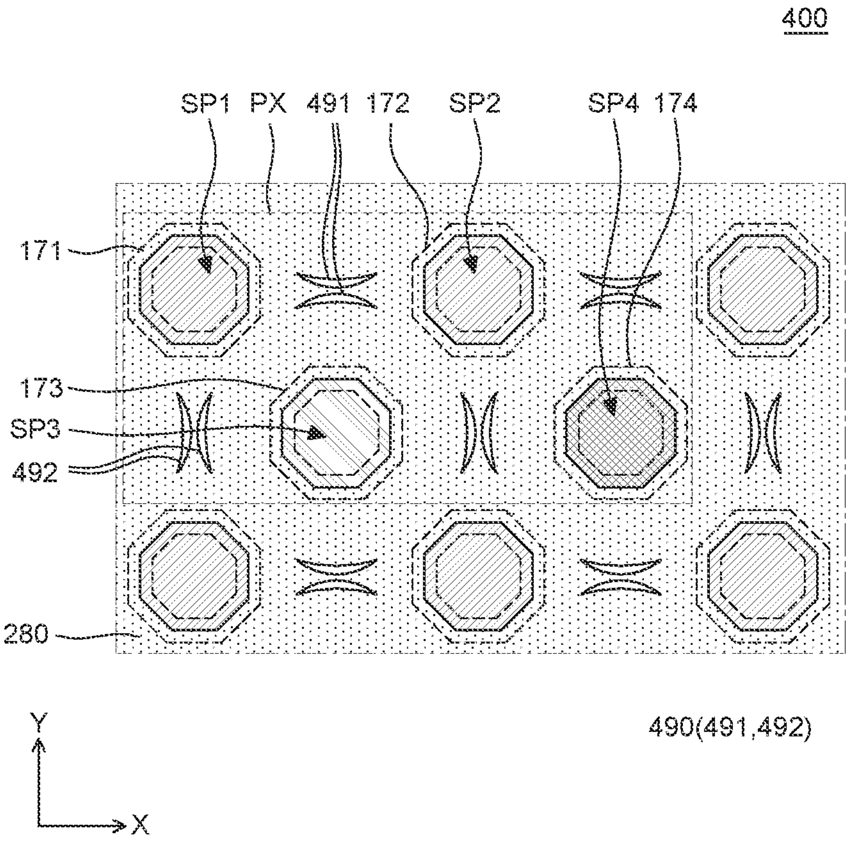
FIG. 8 is an enlarged plan view of a partial area of a display device according to still another example embodiment of the present disclosure.

FIG. 8 is an enlarged plan view of a partial area of a display device according to still another example embodiment of the present disclosure. Other components of a display device 400 illustrated in FIG. 8 are substantially identical to those of the display device 300 illustrated in FIG. 7, except for a shape of spacers. Accordingly, redundant descriptions of the same components will be omitted.

Horizontal spacers 491 and vertical spacers 492 can have crescent shapes on a plane. The crescent shape can be an arch shape in which one surface is convex, and the other surface opposite thereto is concave. Two horizontal spacers 491 having crescent shapes are disposed between the first color filter 171 and the second color filter 172 adjacent to each other. For example, one first color filter 171, two crescent-shaped horizontal spacers 491, and one second color filter 172 are alternately disposed in the first direction (the X-axis direction).

Two vertical spacers 492 having crescent shapes are disposed between the third color filter 173 and the fourth color filter 174 adjacent to each other. For example, one third color filter 173, two vertical spacers 492 having crescent shapes, and one fourth color filter 174 are alternately disposed in the first direction (the X-axis direction).

Each of the two horizontal spacers 491 disposed between the first color filter 171 and the second color filter 172 adjacent to each other can have a crescent shape elongated in the first direction (the X-axis direction). The horizontal spacer 491 having a crescent shape has a convex surface and a concave surface opposite to the convex surface. The two horizontal spacers 491 disposed between the first color filter 171 and the second color filter 172 are disposed such that their respective convex surfaces face each other.

Each of the two vertical spacers 492 disposed between the third color filter 173 and the fourth color filter 174 adjacent to each other can have a crescent shape elongated in the second direction (the Y-axis direction). The vertical spacer 492 having a crescent shape has a convex surface and a concave surface opposite to the convex surface. The two vertical spacers 492 disposed between the third color filter 173 and the fourth color filter 174 are disposed such that their respective convex surfaces face each other. In this example, stress applied to the overcoating layer during folding can be more effectively alleviated, thereby further reducing the occurrence of delamination and cracks. However, the present disclosure is not limited thereto. If necessary, the crescent shaped spacers 490 disposed between the color filters 171, 172, 173, and 174 adjacent to one another can be disposed such that their concave surfaces face each other.

In the display device 400 of the present disclosure, a surface area of an interface in contact with the overcoating layer OC is greatly increased by disposing a plurality of the spacers 490 having crescent shapes that are slimmer than the spacers having a rectangular shape. Accordingly, when the display device 400 is folded or bent, the occurrence of delamination or cracks in the overcoating layer can be further suppressed. In addition, the horizontal spacer 491 and the vertical spacer 492 having crescent shapes are substantially the same except that directions in which they are arranged are different. Accordingly, regardless of a folding direction, equal tensile stress and compressive stress are applied thereto, so that folding characteristics are more excellent.

In addition, the crescent-shaped spacers 490 have a convex surface and a concave surface opposite thereto, thereby providing more irregular patterns compared to the spacers that have a rectangular shape or a bar shape. Accordingly, the moiré effect caused by the color filters 171, 172, 173, and 174 is minimized, so that an effect of further improving display quality is provided.

Figure 9:
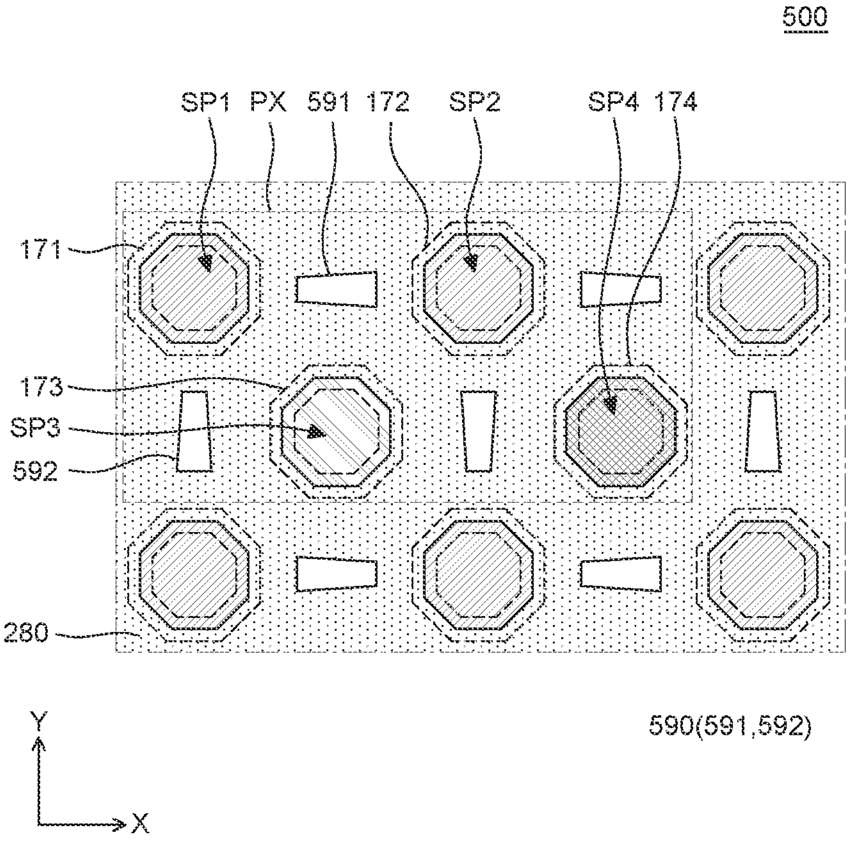
FIG. 9 is an enlarged plan view of a partial area of a display device according to still another example embodiment of the present disclosure.

FIG. 9 is an enlarged plan view of a partial area of a display device according to still another example embodiment of the present disclosure. Other components of a display device 500 illustrated in FIG. 9 are substantially identical to those of the display device 100 illustrated in FIGS. 1 to 4, except for a shape of spacers. Accordingly, redundant descriptions of the same components will be omitted.

Horizontal spacers 591 and vertical spacers 592 can have trapezoidal shapes on a plane. The horizontal spacer 591 having a trapezoidal shape is disposed between the first color filter 171 and the second color filter 172 adjacent to each other. The horizontal spacer 591 can be elongated in the first direction (the X-axis direction) between the first color filter 171 and the second color filter 172. For example, the horizontal spacer 591 can have a trapezoidal shape in which a length of a side in a horizontal direction is greater than a length of a side in a vertical direction on a plane.

The vertical spacer 592 is disposed between the third color filter 173 and the fourth color filter 174 adjacent to each other. The vertical spacer 592 can be elongated in the second direction (the Y-axis direction) between the third color filter 173 and the fourth color filter 174. For example, the vertical spacer 592 can have a trapezoidal shape in which a length of a side in the vertical direction is greater than a length of a side in the horizontal direction on a plane.

The horizontal spacers 591 adjacent to each other can be left and right symmetrical. For example, the horizontal spacer 591 disposed on a left side and the horizontal spacer 591 disposed on a right side of the first color filter 171 or the second color filter 172 can be left and right symmetrical. The vertical spacers 592 adjacent to each other can be vertically symmetrical. For example, the vertical spacer 592 disposed on the left side and the vertical spacer 592 disposed on the right side of the third color filter 173 or the fourth color filter 174 can be vertically symmetrical. When the horizontal spacers 591 adjacent to each other are disposed to be left and right symmetrical and the vertical spacers 592 adjacent to each other are disposed to be vertically symmetrical, as described above, pattern irregularity due to the spacers 590 further increases. Accordingly, it is possible to further suppress the moiré phenomenon due to mutual interference between the regular pattern shape of the color filters and the regularly arranged anodes, thereby minimizing degradation in display quality due to the moiré phenomenon.

Figure 10:
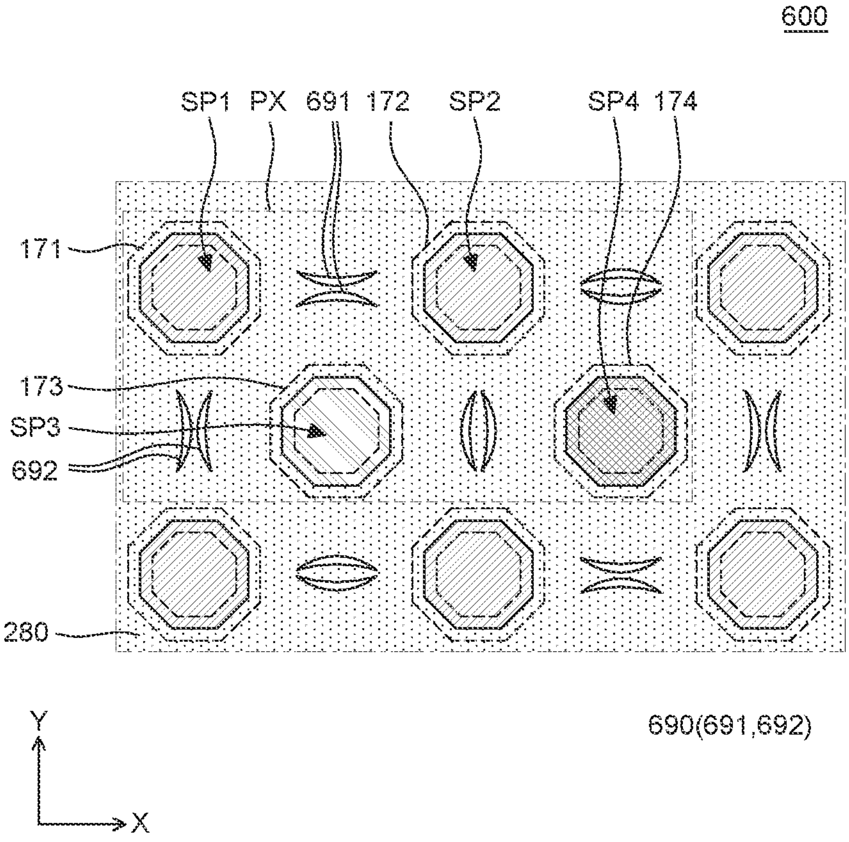
FIG. 10 is an enlarged plan view of a partial area of a display device according to still another example embodiment of the present disclosure.

FIG. 10 is an enlarged plan view of a partial area of a display device according to still another example embodiment of the present disclosure. Other components of a display device 600 illustrated in FIG. 10 are substantially identical to those of the display device 400 illustrated in FIG. 8, except for an arrangement structure of spacers having crescent shapes. Accordingly, redundant descriptions of the same components will be omitted.

Horizontal spacers 691 and vertical spacers 692 can have crescent shapes on a plane. Two horizontal spacers 691 having crescent shapes are disposed between the first color filter 171 and the second color filter 172 adjacent to each other. For example, one first color filter 171, two horizontal spacers 691 having crescent shapes, and one second color filter 172 are alternately disposed in the first direction (the X-axis direction).

Two vertical spacers 692 having crescent shapes are disposed between the third color filter 173 and the fourth color filter 174 adjacent to each other. For example, one third color filter 173, two vertical spacers 692 having crescent shapes, and one fourth color filter 174 are alternately disposed in the first direction (the X-axis direction).

Each of the two horizontal spacers 691 disposed between the first color filter 171 and the second color filter 172 adjacent to each other can have a crescent shape elongated in the first direction (the X-axis direction). The horizontal spacer 691 having a crescent shape has a convex surface and a concave surface opposite to the convex surface. Each of the two vertical spacers 692 disposed between the third color filter 173 and the fourth color filter 174 adjacent to each other can have a crescent shape elongated in the second direction (the Y-axis direction). The vertical spacer 692 having a crescent shape has a convex surface and a concave surface opposite to the convex surface.

The two horizontal spacers 691 disposed between the first color filter 171 and the second color filter 172 are disposed such that their convex surfaces face each other or their concave surfaces face each other. The two vertical spacers 692 disposed between the third color filter 173 and the fourth color filter 174 are disposed such that their convex surfaces face each other or their concave surfaces face each other.

For example, the two horizontal spacers 691 disposed between the second color filter 172 and the first color filter 171 that is adjacent to a left side of the second color filter 172 can be disposed such that their convex surfaces face each other. The two horizontal spacers 691 disposed between the second color filter 172 and the first color filter 171 that is adjacent to a right side of the second color filter 172 can be disposed such that their concave surfaces face each other. The two vertical spacers 692 disposed between the fourth color filter 174 and the third color filter 173 that is adjacent to a left side of the fourth color filter 174 can be disposed such that their concave surfaces face each other. The two vertical spacers 692 disposed between the fourth color filter 174 and the third color filter 173 that is adjacent to a right side of the fourth color filter 174 can be disposed such that their convex surfaces face each other.

For example, the two horizontal spacers 691 with convex surfaces facing each other and the two horizontal spacers 691 with concave surfaces facing each other are alternately disposed in the first direction (the X-axis direction). The two vertical spacers 692 with convex surfaces facing each other and two vertical spacers 692 with concave surfaces facing each other are alternately disposed in the first direction (the X-axis direction).

Accordingly, a surface area at an interface in contact with the overcoating layer is maximized, so that folding characteristics can be further improved and Further, pattern irregularity due to the spacers 690 is maximized. Accordingly, it is possible to further suppress a moiré phenomenon due to mutual interference between a regular pattern shape of the color filters and regularly arranged anodes, thereby minimizing degradation in display quality due to the moiré phenomenon. Accordingly, the display device 600 having excellent folding characteristics and excellent display quality can be provided.

Figure 11:
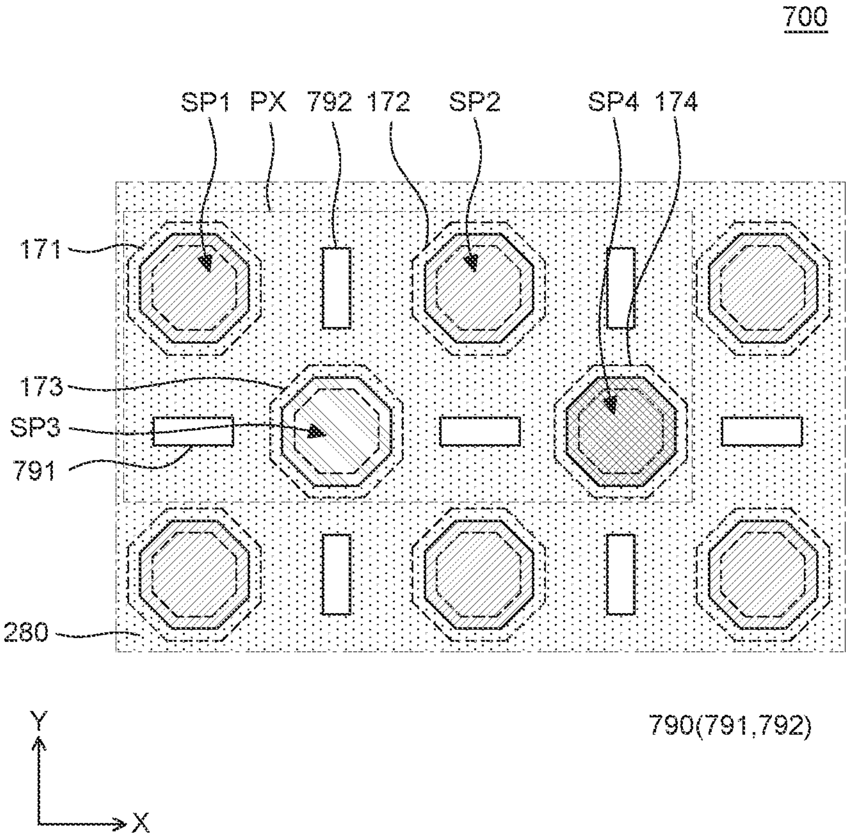
FIG. 11 is an enlarged plan view of a partial area of a display device according to still another example embodiment of the present disclosure.

FIG. 11 is an enlarged plan view of a partial area of a display device according to still another example embodiment of the present disclosure. Other components of a display device 700 illustrated in FIG. 11 are substantially identical to those of the display device 100 illustrated in FIGS. 1 to 4, except for a shape of spacers. Accordingly, redundant descriptions of the same components will be omitted or may be briefly provided.

Referring to FIG. 11, horizontal spacers 791 and vertical spacers 792 can have rectangular shapes on a plane. The horizontal spacer 791 is disposed between the first color filter 171 and another first color filter 171 adjacent to each other. The horizontal spacer 791 can be elongated in the first direction (the X-axis direction) between the first color filters 171. Also, the vertical spacer 792 is disposed between the first color filter 171 and a second color filter 172 adjacent to each other. The vertical spacer 792 can be elongated in the second direction (Y-axis direction) between the first color filter 171 and the second color filter 172. The horizontal spacer 791 and the vertical spacer 792 can be arranged towards the third color filter 173 or the fourth color filter 174. In various embodiments of the present disclosure, the horizontal spacer 791 and the vertical spacer 792 can have shapes as provided in FIGS. 7-10 as well as other variations. Additionally, the lengths of the horizontal spacer 791 and the vertical spacer 792 can be the same or different. For example, the lengths of the horizontal spacers 791 can be different from that of the vertical spacers 792, or each of the horizontal spacers 791 and the vertical spacers 792 can all have different lengths.

Figure 12:
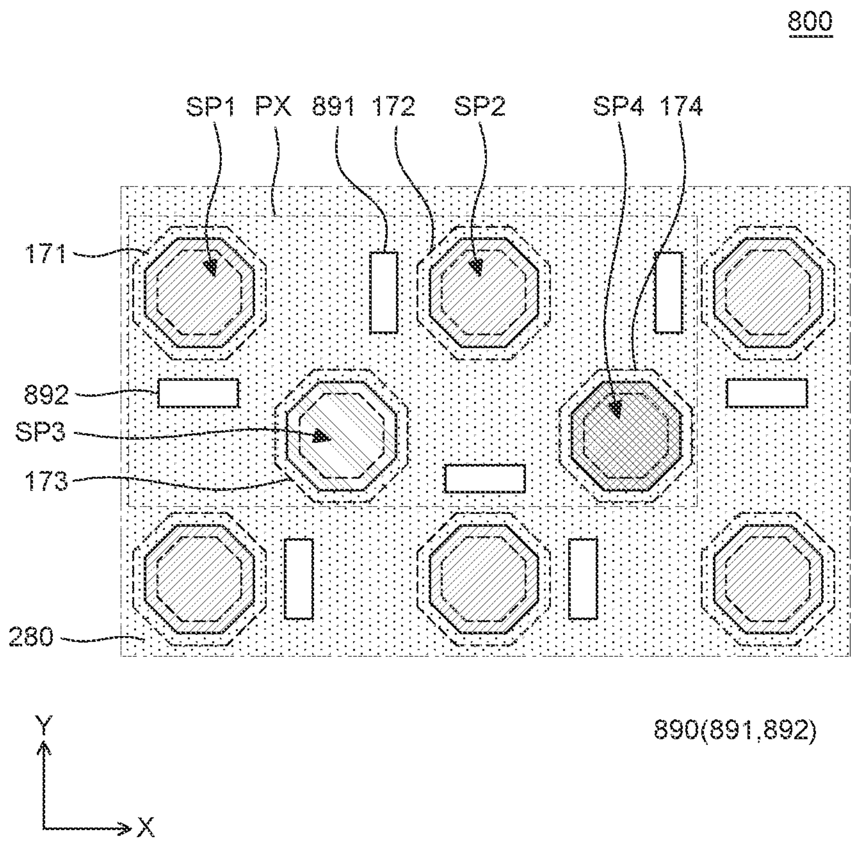
FIG. 12 is an enlarged plan view of a partial area of a display device according to still another example embodiment of the present disclosure.

FIG. 12 is an enlarged plan view of a partial area of a display device according to still another example embodiment of the present disclosure. Other components of a display device 800 illustrated in FIG. 12 are substantially identical to those of the display device 100 illustrated in FIGS. 1 to 4, except for a shape of spacers. Accordingly, redundant descriptions of the same components will be omitted or may be briefly provided.

FIG. 12 shows the horizontal spacers 891 and the vertical spacers 892 positioned not at the center of the distance between adjacent color filters among the color filters 171, 172, 173, and 174, but shifted to one side of the distance. For example, the horizontal spacer 891 is located closer to the second color filter 172 than to the first color filter 171, and the vertical spacer 892 is located closer to the first color filter 171 on the top row than to the first color filter 171 on the bottom row. The shifted locations of the horizontal spacers 891 and the vertical spacers 892 of the present disclosure are not limited to thereto, and the horizontal spacers 891 and the vertical spacers 892 can be shifted to closer to the other color filters among the color filters 171, 172, 173, and 174. Also, the horizontal spacers 891 and the vertical spacers 892 need not be located at center line between adjacent color filters among the color filters 171, 172, 173, and 174, but can be offset from the center lines. Accordingly, the horizontal spacer 891 can be shifted upward or downward from the center line, and the vertical spacer 892 can be shifted leftward or rightward from the center line in other embodiments of the present disclosure.

Figure 13:
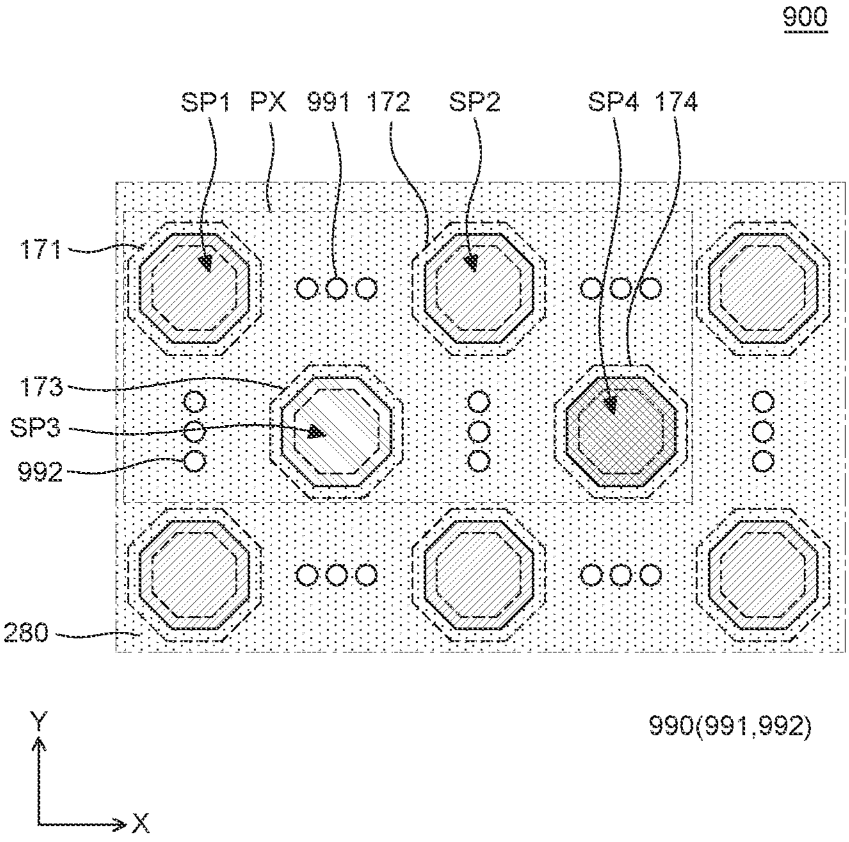
FIG. 13 is an enlarged plan view of a partial area of a display device according to still another example embodiment of the present disclosure.

FIG. 13 is an enlarged plan view of a partial area of a display device according to still another example embodiment of the present disclosure. Other components of a display device 900 illustrated in FIG. 13 are substantially identical to those of the display device 100 illustrated in FIGS. 1 to 4, except for a shape of spacers. Accordingly, redundant descriptions of the same components will be omitted or may be briefly provided.

In FIG. 13, the horizontal spacers 991 and the vertical spacers 992 are provided in multiples, such as a group of circular sub-spacers. The sub-spacers of the horizontal spacers 991 and the vertical spacers 992 can be arranged to extend in their respective X-axis direction or Y-axis direction. Although the sub-spacers are shown as being aligned along a centerline between adjacent color filters among the color filters 171, 172, 173, and 174, the present disclosure is not limited to thereto, and the sub-spacers can be offset from each other.

Figure 14:
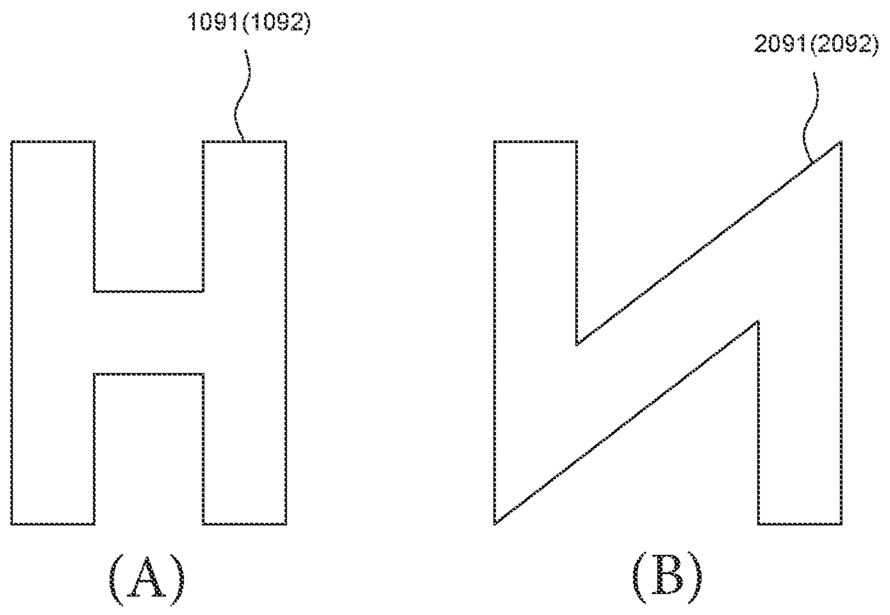
FIG. 14, including (A) and (B), illustrates examples of spacers of a display device according to another example embodiment of the present disclosure.

FIG. 14 shows examples of spacers of a display device according to another example embodiment of the present disclosure. Unlike the spacers shown in FIGS. 2, 5 and 7, for example, the spacers 1091 (or 1092) in (A) of FIG. 14, and spacers 2091 (or 2092) in (B) of FIG. 14 can be of non-rectangular shape. For example, (A) of FIG. 14 shows an H-shaped horizontal spacer 1091 (or can be the vertical spacer 1092 when rotated, such as 90°). Also, (B) of FIG. 14 shown a Z-Shaped horizontal spacer 2091 (or can be the vertical spacer 2092 when rotated, such as 90°). Accordingly, the spacers in various embodiments of the present disclosure can be of various patterns or shapes, or can be even letters or letter-like patterns, but embodiments of present disclosure are not limited to thereto. Other shapes, such as stars, rings, foreign text can also be used for the shapes of the spacers.

Figure 15:
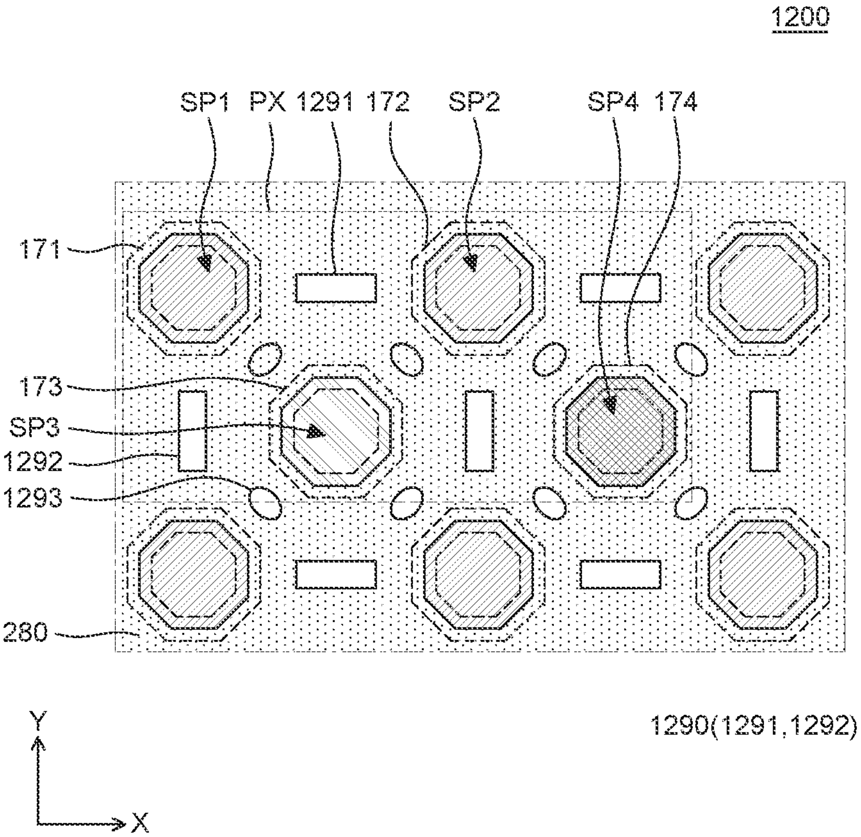
FIG. 15 is an enlarged plan view of a partial area of a display device according to still another example embodiment of the present disclosure.

FIG. 15 is an enlarged plan view of a partial area of a display device according to still another example embodiment of the present disclosure. Other components of a display device 1200 illustrated in FIG. 15 are substantially identical to those of the display device 100 illustrated in FIGS. 1 to 4, except for a shape of spacers. Accordingly, redundant descriptions of the same components will be omitted or may be briefly provided.

FIG. 15 shows horizontal spacers 1291 and vertical spacers 1292, as well as auxiliary spacers 1923 that can be provided both between horizontal spacers 1291 and vertical spacers 1292 and between adjacent color filters among the color filters 171, 172, 173, and 174. Accordingly, the horizontal spacers 1291, the vertical spacers 1292, and the auxiliary spacers 1923 provide additional surface area to minimize delamination or damage to the overcoating layer OC during folding of the display device 1200. But embodiments of present disclosure are not limited to thereto.

The example embodiments of the present disclosure can also be described as follows:

According to an aspect of the present disclosure, a display device comprises a substrate on which a plurality of sub-pixels are defined; an organic light emitting element disposed on the substrate and disposed to correspond to each of the plurality of sub-pixels; an encapsulation layer on the organic light emitting element; a plurality of color filters disposed on the encapsulation layer to correspond to the plurality of sub-pixels; a black matrix disposed between the plurality of color filters; a plurality of spacers positioned between the plurality of color filters and disposed on the black matrix; and an overcoating layer disposed to cover the color filter, the black matrix, and the spacers, wherein each of the plurality of spacers has a reverse tapered shape.

The spacer can include a black material.

The black matrix and the spacer can include the same material.

The black matrix and the spacer can be integrally formed.

The display device can further comprise a touch sensor unit including a first buffer layer disposed on the encapsulation layer, at least one insulating layer disposed on the first buffer layer, and a plurality of touch electrodes disposed on the at least one insulating layer; and a second buffer layer disposed on the touch sensor unit to cover the plurality of touch electrodes, wherein the color filters and the black matrix can be disposed on the second buffer layer, and at least portions of the plurality of spacers can be disposed on the black matrix to overlap the touch electrodes.

An upper width of the black matrix and a lower width of the spacer can be equal and completely overlap each other.

The black matrix can cover at least portions of upper surfaces and side surfaces of the color filters.

An upper width of each of the plurality of spacers can be smaller than an upper width of the black matrix.

The plurality of sub-pixels can include a first sub-pixel, a second sub-pixel, a third sub-pixel, and a fourth sub-pixel, wherein the first sub-pixel and the second sub-pixel can be alternately disposed in a first direction, and the third sub-pixel and the fourth sub-pixel can be alternately disposed in the first direction and can be disposed in a zigzag manner with the first sub-pixel and the second sub-pixel, wherein the plurality of color filters can include a first color filter corresponding to the first sub-pixel, a second color filter corresponding to the second sub-pixel, a third color filter corresponding to the third sub-pixel, and a fourth color filter corresponding to the fourth sub-pixel, wherein the first color filter and the second color filter can be alternately disposed in the first direction, and the third color filter and the fourth color filter can be disposed in a zigzag manner with the first color filter and the second color filter and can be alternately disposed in the first direction.

The plurality of spacers can include a plurality of horizontal spacers and a plurality of vertical spacers, wherein each of the plurality of horizontal spacers can be disposed between the first color filter and the second color filter, and each of the plurality of vertical spacers can be disposed between the third color filter and the fourth color filter.

The plurality of horizontal spacers and the plurality of vertical spacers can have a rectangular shape, a trapezoidal shape, or a crescent shape on a plane.

The plurality of horizontal spacers and the plurality of vertical spacers can have a rectangular shape or a trapezoidal shape on a plane, and the plurality of horizontal spacers can extend and be elongated in the first direction, and the plurality of vertical spacers can extend and be elongated in a second direction perpendicular to the first direction.

The plurality of horizontal spacers and the plurality of vertical spacers can have trapezoidal shapes on a plane, wherein horizontal spacers adjacent to each other among the plurality of horizontal spacers can be left and right symmetrical, and vertical spacers adjacent to each other among the plurality of vertical spacers can be vertically symmetrical.

The number of horizontal spacers disposed between the first color filter and the second color filter adjacent to each other can be at least two, and the number of vertical spacers disposed between the third color filter and the fourth color filter adjacent to each other can be at least two.

The horizontal spacers and the vertical spacers can have a rectangular shape on a plane, and the horizontal spacers can extend in the first direction, and the vertical spacers can extend in the second direction.

The horizontal spacers and the vertical spacers can have crescent shapes on a plane, the number of horizontal spacers disposed between the first color filter and the second color filter adjacent to each other can be at least two, and the number of vertical spacers disposed between the third color filter and the fourth color filter adjacent to each other can be at least two.

The two horizontal spacers disposed between the first color filter and the second color filter adjacent to each other can be disposed such that convex surfaces face each other, and the two vertical spacers disposed between the third color filter and the fourth color filter adjacent to each other can be disposed such that convex surfaces face each other.

The two horizontal spacers disposed between the second color filter and the first color filter disposed adjacent to one side of the second color filter can be disposed such that convex surfaces face each other, the two horizontal spacers disposed between the second color filter and the first color filter disposed adjacent to the other side of the second color filter can be disposed such that concave surfaces face each other, the two vertical spacers disposed between the fourth color filter and the third color filter disposed adjacent to one side of the fourth color filter can be disposed such that their concave surfaces face each other, and the two vertical spacers disposed between the fourth color filter and the third color filter disposed adjacent to the other side of the fourth color filter can be disposed such that convex surfaces face each other.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate on which a plurality of sub-pixels are defined;

an organic light emitting element disposed on the substrate and disposed to correspond to each sub-pixel of the plurality of sub-pixels;

an encapsulation layer disposed on the organic light emitting element;

a plurality of color filters disposed on the encapsulation layer to correspond to the plurality of sub-pixels, respectively;

a black matrix disposed between the plurality of color filters;

a plurality of spacers positioned between the plurality of color filters and disposed on the black matrix; and an overcoating layer disposed to cover the plurality of color filters, the black matrix, and the plurality of spacers, wherein each of the plurality of spacers has a first surface closest to the encapsulation layer and a second surface distal from the first surface, wherein a width of the second surface is greater than a width of the first surface, and wherein the overcoating layer is in direct contact with side surfaces of each of the plurality of spacers to cover the plurality of spacers.

2. The display device of claim 1, wherein each of the plurality of spacers includes a black material.

3. The display device of claim 1, wherein the black matrix and each spacer include a same material.

4. The display device of claim 3, wherein the black matrix and a spacer of the plurality of spacers are integrally formed.

5. The display device of claim 1, further comprising:

a touch sensor unit including a first buffer layer disposed on the encapsulation layer, at least one insulating layer disposed on the first buffer layer, and a plurality of touch electrodes disposed on the at least one insulating layer; and a second buffer layer disposed on the touch sensor unit to cover the plurality of touch electrodes, wherein the plurality of color filters and the black matrix are disposed on the second buffer layer, and at least portions of the plurality of spacers are disposed on the black matrix to overlap the plurality of touch electrodes.

6. The display device of claim 5, wherein an upper width of the black matrix and a lower width of a spacer corresponding thereto among the plurality of spacers are equal and completely overlap each other.

7. The display device of claim 5, wherein the black matrix covers at least portions of upper surfaces and side surfaces of the plurality of color filters.

8. The display device of claim 7, wherein an upper width of each of the plurality of spacers is smaller than an upper width of the black matrix.

9. The display device of claim 1, wherein the plurality of sub-pixels include a first sub-pixel, a second sub-pixel, a third sub-pixel, and a fourth sub-pixel, wherein the first sub-pixel and the second sub-pixel are alternately disposed in a first direction, and the third sub-pixel and the fourth sub-pixel are alternately disposed in the first direction and are disposed in a zigzag manner with the first sub-pixel and the second sub-pixel, wherein the plurality of color filters include a first color filter corresponding to the first sub-pixel, a second color filter corresponding to the second sub-pixel, a third color filter corresponding to the third sub-pixel, and a fourth color filter corresponding to the fourth sub-pixel, and wherein the first color filter and the second color filter are alternately disposed in the first direction, and the third color filter and the fourth color filter are disposed in the zigzag manner with the first color filter and the second color filter and are alternately disposed in the first direction.

10. The display device of claim 9, wherein the plurality of spacers include a plurality of horizontal spacers and a plurality of vertical spacers, and wherein:

each of the plurality of horizontal spacers is disposed between the first color filter and the second color filter, and each of the plurality of vertical spacers is disposed between the third color filter and the fourth color filter, or each of the plurality of horizontal spacers is disposed between the third color filter and the fourth color filter, and each of the plurality of vertical spacers is disposed between the first color filter and the second color filter.

11. The display device of claim 10, wherein the plurality of horizontal spacers and the plurality of vertical spacers have a rectangular shape, a trapezoidal shape, a circular shape, or a crescent shape on a plane view.

12. The display device of claim 11, wherein the plurality of horizontal spacers and the plurality of vertical spacers have the rectangular shape or the trapezoidal shape on the plane view, and wherein the plurality of horizontal spacers extend and are elongated in the first direction, and the plurality of vertical spacers extend and are elongated in a second direction perpendicular to the first direction.

13. The display device of claim 12, wherein the plurality of horizontal spacers and the plurality of vertical spacers have the trapezoidal shapes on the plane view, and wherein adjacent horizontal spacers adjacent to each other among the plurality of horizontal spacers are left and right symmetrical, and adjacent vertical spacers adjacent to each other among the plurality of vertical spacers are vertically symmetrical.

14. The display device of claim 11, wherein the number of the plurality of horizontal spacers disposed between the first color filter and the second color filter adjacent to each other are at least two, and the number of the plurality of vertical spacers disposed between the third color filter and the fourth color filter adjacent to each other are at least two.

15. The display device of claim 14, wherein the plurality of horizontal spacers and the plurality of vertical spacers have crescent shapes on the plane view, the number of horizontal spacers disposed between the first color filter and the second color filter adjacent to each other are at least two from among the plurality of horizontal spacers, and the number of vertical spacers disposed between the third color filter and the fourth color filter adjacent to each other are at least two from among the plurality of vertical spacers, wherein: the two horizontal spacers or the two vertical spacers are disposed so that convex surfaces face each other, or concave surfaces face each other.

16. The display device of claim 1, wherein each spacer has a reverse tapered shape.

17. The display device of claim 1, wherein the plurality of spacers include a plurality of auxiliary spacers, and wherein at least one of the plurality of auxiliary spacers is located between a first color filter and a third color filter among a first, a second, a third and a fourth of the plurality of color filters, and between one horizontal spacer and one vertical spacer among the plurality of spacers.

18. A method of forming a display panel having spacers, the method comprising:

forming organic light emitting elements on a substrate;

forming an encapsulation layer on the organic light emitting elements;

forming a touch sensor unit on the encapsulation layer;

forming a color filter layer on the touch sensor unit;

coating a composition on the color filter layer, the composition including a base resin and a black material;

pre-baking the coated composition;

exposing the coated composition using a mask and over-curing an upper surface of the composition relative to a lower portion of the composition to form a black matrix and the spacers;

developing the exposed composition to simultaneously form the black matrix and the spacers; and forming an overcoat layer on the color filter layer and the spacers, wherein the spacers have a reverse taper shape.

19. The method of forming the display panel having spacers of claim 18, further comprising:

exposing the coated composition using a halftone mask after the pre-baking of the coated composition; and performing a primary development on the exposed coated composition after the exposing the coated composition using the halftone mask, and before exposing the coated composition using the mask.

20. The method of forming the display panel having spacers of claim 19, wherein a second intensity of light use in the exposing the coated composition using the mask is greater than a first intensity of light used in the exposing the coated composition using the halftone mask.

* * * * *